United States Patent [19]
Kawabata et al.

[11] Patent Number: 6,130,849
[45] Date of Patent: Oct. 10, 2000

[54] SEMICONDUCTOR MEMORY DEVICE AND DATA BUS AMPLIFIER ACTIVATION METHOD FOR THE SEMICONDUCTOR MEMORY DEVICE

[75] Inventors: Kuninori Kawabata; Masato Matsumiya; Satoshi Eto; Yuichi Uzawa; Toru Koga; Akira Kikutake, all of Kawasaki, Japan

[73] Assignee: Fujitsu Limited, Kawasaki, Japan

[21] Appl. No.: 09/300,269

[22] Filed: Apr. 27, 1999

[30]     Foreign Application Priority Data

Jun. 26, 1998   [JP]   Japan .................................. 10-179476

[51] Int. Cl.[7] ....................................................... G11C 7/02
[52] U.S. Cl. ............................................ 365/207; 365/190
[58] Field of Search ..................... 365/190, 207, 365/233

[56]             References Cited

U.S. PATENT DOCUMENTS 5,740,123   4/1998   Uchida ..................... 365/233
5,936,897   8/1999   Koga ....................... 365/190

*Primary Examiner*—David Nelms
*Assistant Examiner*—M. Tran
*Attorney, Agent, or Firm*—Arent Fox Kintner Plotkin & Kahn PLLC

[57]             ABSTRACT

In a data bus amplifier activation method for a semiconductor memory device having a memory cell array, a column selection circuit for selecting a column in the memory cell array, a read data bus for transferring read data, output from the column selected by the column selection circuit, to a read data bus amplifier, and a write data bus for transferring write data, output from a write data bus amplifier, to the column selected by the column selection circuit, the read data bus amplifier or the write data bus amplifier is activated by detecting the selection of the column effected by the column selection circuit. By so doing, a read data bus amplifier enable signal or a write data bus amplifier enable signal can be generated after the occurrence of a column select signal, eliminating the need to allow a large margin for the generation timing of the read data bus amplifier enable signal or the write data bus amplifier enable signal, and as a result, the operating speed of the semiconductor memory device can be increased.

66 Claims, 15 Drawing Sheets

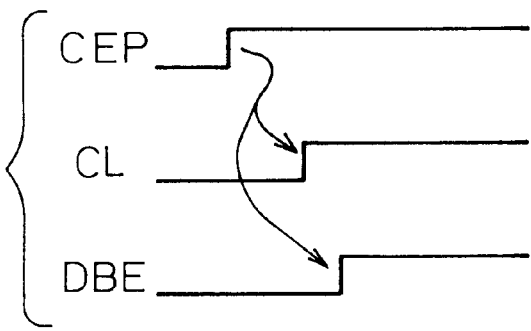
Fig.26A (PRIOR ART) — [TARGET GENERATION TIMINGS OF CL & DBE]
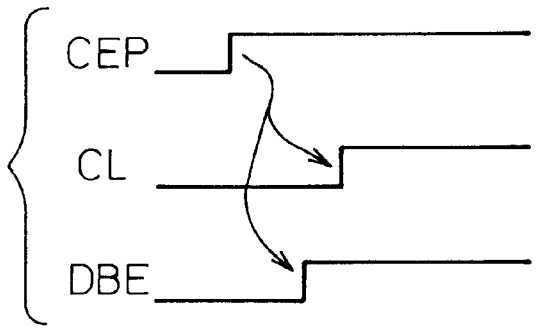
Fig.26B (PRIOR ART) — [WORST-CASE EXAMPLE OF CL & DBE GENERATION TIMINGS]

SEMICONDUCTOR MEMORY DEVICE AND DATA BUS AMPLIFIER ACTIVATION METHOD FOR THE SEMICONDUCTOR MEMORY DEVICE

BACKGROUND OF THE INVENTION

1. Field of the Invention

The present invention relates to a semiconductor memory device and a data bus amplifier activation method for the semiconductor memory device, and more particularly, to a semiconductor memory device that requires activating a data bus amplifier after the activation of a column select line and a method of activating a data bus amplifier in such a semiconductor memory device.

2. Description of the Related Art

Recent semiconductor technology has developed high-speed, high-integrated semiconductor memories such as dynamic random access memories (DRAMs). Among them, synchronous DRAMs (SDRAMs) operate in synchronization with an external clock signal to improve the operation speed thereof and to realize pipeline operations therein.

Namely, for example, the SDRAMs are required to operate synchronously with 100 MHz or higher clock speeds. This necessarily demands more efficient activation of data bus amplifiers.

Prior art and the problems thereof will be explained later with reference to accompanying drawings.

SUMMARY OF THE INVENTION

An object of the present invention is to provide a data bus amplifier activation method for a semiconductor memory device wherein higher operating speed is achieved by eliminating the need to allow a large margin for the generation timing of a data bus amplifier enable signal used to activate a data bus amplifier associated with a data bus. Another object of the invention is to provide such a semiconductor memory device.

According to the present invention, there is provided a data bus amplifier activation method for a semiconductor memory device having a memory cell array, a column selection circuit for selecting a column in the memory cell array, a read data bus for transferring read data, output from the column selected by the column selection circuit, to a read data bus amplifier, and a write data bus for transferring write data, output from a write data bus amplifier, to the column selected by the column selection circuit, wherein the read data bus amplifier or the write data bus amplifier is activated by detecting the selection of the column effected by the column selection circuit.

According to the present invention, there is also provided a data bus amplifier activation method for a semiconductor memory device having a memory cell array, a column selection circuit for selecting a column in the memory cell array, and a data bus for transferring read data, output from the column selected by the column selection circuit, to a read data bus amplifier, or write data, output from a write data bus amplifier, to the column selected by the column selection circuit, wherein the read data bus amplifier or the write data bus amplifier is activated by detecting the selection of the column effected by the column selection circuit.

Further, according to the present invention, there is provided a semiconductor memory device having a memory cell array, a column selection circuit for selecting a column in the memory cell array, a read data bus for transferring read data, output from the column selected by the column selection circuit, to a read data bus amplifier, and a write data bus for transferring write data, output from a write data bus amplifier, to the column selected by the column selection circuit, wherein the semiconductor memory device includes a column selection detecting/data bus amplifier activating circuit for activating the read data bus amplifier or the write data bus amplifier by detecting the selection of the column effected by the column selection circuit.

In addition, according to the present invention, there is also provided a semiconductor memory device having a memory cell array, a column selection circuit for selecting a column in the memory cell array, and a data bus for transferring read data, output from the column selected by the column selection circuit, to a read data bus amplifier, or write data, output from a write data bus amplifier, to the column selected by the column selection circuit, wherein the semiconductor memory device includes a column selection detecting/data bus amplifier activating circuit for activating the read data bus amplifier or the write data bus amplifier by detecting the selection of the column effected by the column selection circuit.

The column selection detecting/data bus amplifier activating circuit may comprise a column selection detecting circuit which detects the selection of the column effected by the column selection circuit and outputs a column selection detection signal, and a data bus amplifier activating circuit which outputs a read data bus amplifier enable signal for activating the read data bus amplifier when the column selection detection signal is output at the time of reading, and which generates a write data bus amplifier enable signal for activating the write data bus amplifier when the column selection detection signal is output at the time of writing. The column selection detecting circuit may include a wired-OR circuit for ORing column select line levels.

The data bus amplifier activating circuit may comprises a data bus amplifier enable base signal generating circuit which takes the column selection detection signal as an input and generates a data bus amplifier enable base signal; a read data bus amplifier enable signal generating circuit which generates the read data bus amplifier enable signal when the data bus amplifier enable base signal is generated at the time of reading; and a write data bus amplifier enable signal generating circuit which generates the write data bus amplifier enable signal when the data bus amplifier enable base signal is generated at the time of writing. The data bus amplifier enable base signal generating circuit may be constructed so that the generation timing of the data bus amplifier enable base signal is determined relative to the generation timing of the column selection detection signal. The data bus amplifier enable base signal generating circuit may include a timing adjusting circuit capable of adjusting the generation timing of the data bus amplifier enable base signal.

The data bus amplifier enable base signal generating circuit may be constructed so that the deactivation timing of the data bus amplifier enable base signal is determined relative to the deactivation timing of the column selection detection signal. The data bus amplifier enable base signal generating circuit may include a timing adjusting circuit capable of adjusting the deactivation timing of the data bus amplifier enable signal.

The data bus amplifier enable base signal generating circuit may be constructed so that the deactivation timing of the data bus amplifier enable base signal is determined relative to the generation timing of the column selection detection signal. The data bus amplifier enable base signal generating circuit may include a timing adjusting circuit capable of adjusting the deactivation timing of the data bus amplifier enable base signal.

The data bus amplifier enable base signal generating circuit may comprise a first variable delay circuit for delaying the column selection detection signal; a first NAND circuit for NANDing the column selection detection signal with an output of the first variable delay circuit; a second variable delay circuit for delaying an output of the first NAND circuit; and a second NAND circuit for outputting the data bus amplifier enable base signal by NANDing the output of the first NAND circuit with an output of the second variable delay circuit.

The data bus amplifier enable base signal generating circuit may comprise a variable delay circuit for delaying the column selection detection signal; a NAND circuit for NANDing the column selection detection signal with an output of the variable delay circuit; a first NOR circuit, with one input terminal thereof coupled to an output terminal of the NAND circuit, for outputting the data bus amplifier enable base signal; an inverter for inverting the data bus amplifier enable base signal; a variable inverting delay circuit for inverting and delaying the data bus amplifier enable base signal; and a second NOR circuit, with an output terminal thereof coupled to the other input terminal of the first NOR circuit, for NORing an output of the inverter with an output of the variable inverting delay circuit.

The read data bus amplifier enable signal generating circuit may include a first logic circuit for performing a logic operation between the data bus amplifier enable base signal and a first state indicating signal that indicates whether or not reading is taking place, and the write data bus amplifier enable signal generating circuit may include a second logic circuit for performing a logic operation between the data bus amplifier enable base signal and a second state indicating signal that indicates whether or not writing is taking place. The first logic circuit may include a first AND circuit for ANDing the first state indicating signal with the data bus amplifier enable base signal, and the second logic circuit may include a second AND circuit for ANDing the second state indicating signal with the data bus amplifier enable base signal.

The data bus amplifier activating circuit may comprise a read data bus amplifier enable signal generating circuit which generates the read data bus amplifier enable signal when the column selection detection signal is generated at the time of reading; and a write data bus amplifier enable signal generating circuit which generates the write data bus amplifier enable signal when the column selection detection signal is generated at the time of writing. The read data bus amplifier enable signal generating circuit may be constructed so that the generation timing of the read data bus amplifier enable signal is determined relative to the generation timing of the column selection detection signal. The read data bus amplifier enable signal generating circuit may include a timing adjusting circuit capable of adjusting the generation timing of the read data bus amplifier enable signal.

The read data bus amplifier enable signal generating circuit may be constructed so that the deactivation timing of the read data bus amplifier enable signal is determined relative to the deactivation timing of the column selection detection signal. The read data bus amplifier enable signal generating circuit may include a timing adjusting circuit capable of adjusting the deactivation timing of the read data bus amplifier enable signal.

The read data bus amplifier enable signal generating circuit may be constructed so that the deactivation timing of the read data bus amplifier enable signal is determined relative to the generation timing of the column selection detection signal. The read data bus amplifier enable signal generating circuit may include a timing adjusting circuit capable of adjusting the deactivation timing of the read data bus amplifier enable signal.

The read data bus amplifier enable signal generating circuit may comprise an AND circuit for ANDing the column selection detection signal with a first state indicating signal that indicates whether or not reading is taking place; a first variable delay circuit for delaying an output of the AND circuit; a first NAND circuit for NANDing the output of the AND circuit with an output of the first variable delay circuit; a second variable delay circuit for delaying an output of the first NAND circuit; and a second NAND circuit for outputting the read data bus amplifier enable signal by NANDing the output of the first NAND circuit with an output of the second variable delay circuit. The read data bus amplifier enable signal generating circuit may comprise an AND circuit for ANDing the column selection detection signal with a first state indicating signal that indicates whether or not reading is taking place; a variable delay circuit for delaying an output of the AND circuit; a NAND circuit for NANDing the output of the AND circuit with an output of the variable delay circuit; a first NOR circuit, with one input terminal thereof coupled to an output terminal of the NAND circuit, for outputting the read data bus amplifier enable signal; an inverter for inverting the read data bus amplifier enable signal; a variable inverting delay circuit for inverting and delaying the read data bus amplifier enable signal; and a second NOR circuit, with an output terminal thereof coupled to the other input terminal of the first NOR circuit, for NORing an output of the inverter with an output of the variable inverting delay circuit.

The write data bus amplifier enable signal generating circuit may be constructed so that the generation timing of the write data bus amplifier enable signal is determined relative to the generation timing of the column selection detection signal. The write data bus amplifier enable signal generating circuit may include a timing adjusting circuit capable of adjusting the generation timing of the write data bus amplifier enable signal.

The write data bus amplifier enable signal generating circuit may be constructed so that the deactivation timing of the write data bus amplifier enable signal is determined relative to the deactivation timing of the column selection detection signal. The write data bus amplifier enable signal generating circuit may include a timing adjusting circuit capable of adjusting the deactivation timing of the write data bus amplifier enable signal.

The write data bus amplifier enable signal generating circuit may be constructed so that the deactivation timing of the write data bus amplifier enable signal is determined relative to the generation timing of the column selection detection signal. The write data bus amplifier enable signal generating circuit may include a timing adjusting circuit capable of adjusting the deactivation timing of the write data bus amplifier enable signal.

The write data bus amplifier enable signal generating circuit may comprise an AND circuit for ANDing the column selection detection signal with a second state indicating signal that indicates whether or not writing is taking place; a first variable delay circuit for delaying an output of the AND circuit; a first NAND circuit for NANDing the output of the AND circuit with an output of the first variable delay circuit; a second variable delay circuit for delaying an output of the first NAND circuit; and a second NAND circuit for outputting the write data bus amplifier enable signal by NANDing the output of the first NAND circuit with an output of the second variable delay circuit.

The write data bus amplifier enable signal generating circuit may comprise an AND circuit for ANDing the column selection detection signal with a second state indicating signal that indicates whether or not writing is taking place; a variable delay circuit for delaying an output of the AND circuit; a NAND circuit for NANDing the output of the AND circuit with an output of the variable delay circuit; a first NOR circuit, with one input terminal thereof coupled to an output terminal of the NAND circuit, for outputting the write data bus amplifier enable signal; an inverter for inverting the write data bus amplifier enable signal; a variable inverting delay circuit for inverting and delaying the write data bus amplifier enable signal; and a second NOR circuit, with an output terminal thereof coupled to the other input terminal of the first NOR circuit, for NORing an output of the inverter with an output of the variable inverting delay circuit.

The column selection circuit and the column selection detecting circuit may be disposed opposite each other across the memory cell array.

BRIEF DESCRIPTION OF THE DRAWINGS

The present invention will be more clearly understood from the description of the preferred embodiments as set forth below with reference to the accompanying drawings, wherein:

FIGS. 26A and 26B are diagrams for explaining the problem associated with the prior art SDRAM shown in FIG. 25.

DESCRIPTION OF THE PREFERRED EMBODIMENTS

Before describing the preferred embodiments of the present invention, the prior art and its associated problem will be described first.

Figure 25:
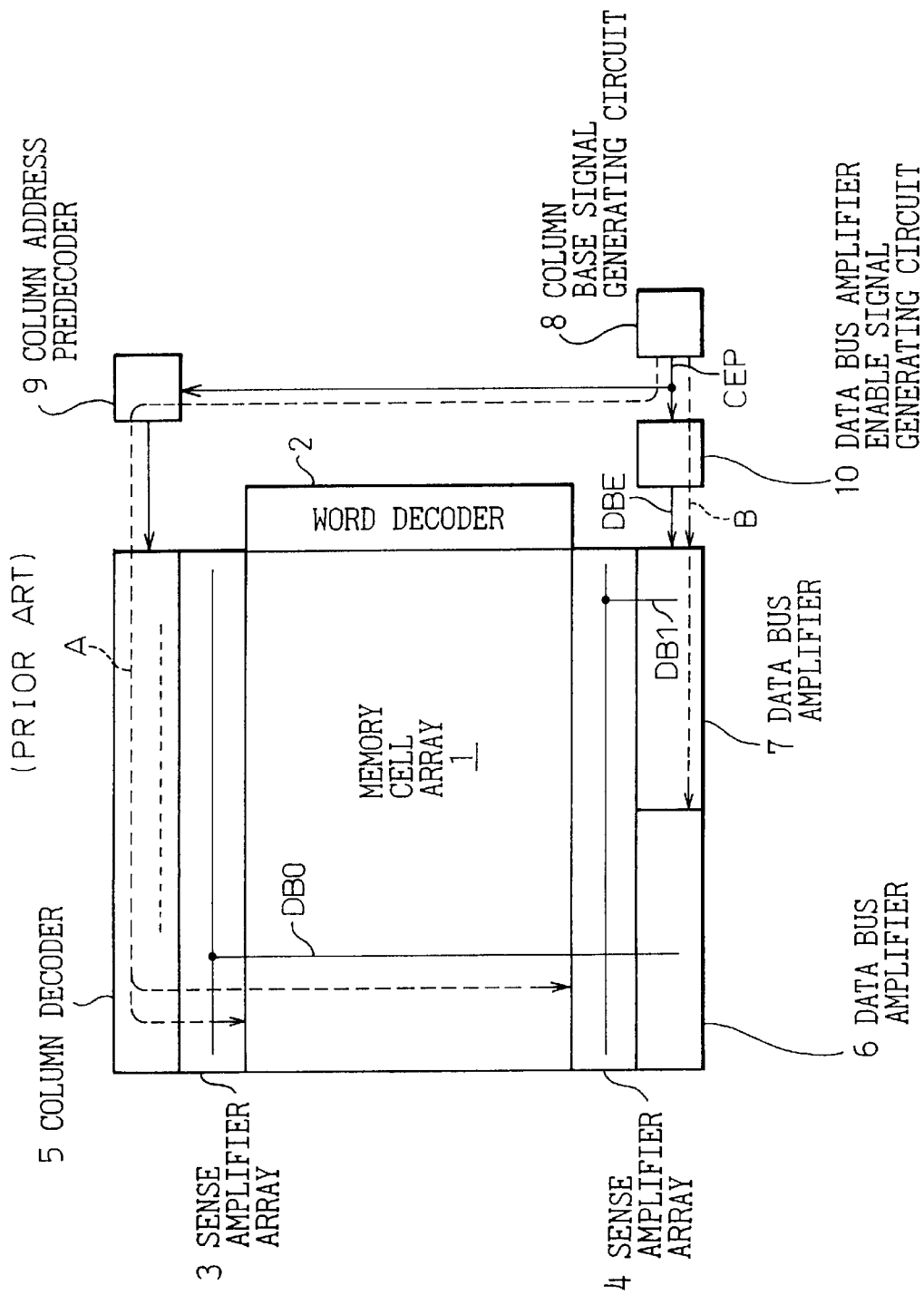
FIG. 25 is a conceptual diagram showing an essential portion of a synchronous dynamic random access memory (SDRAM) according to one example of the prior art.

FIG. 25 is a conceptual diagram showing an essential portion of an SDRAM according to one example of the prior art. In FIG. 25, reference numeral 1 is a memory cell array containing memory cells, 2 is word decoder for selecting a word line, 3 and 4 are sense amplifier arrays containing sense amplifiers, and 5 is a column decoder forming a column selection circuit for selecting a column by outputting a column select signal CL. Reference character DB0 is a data bus associated with the sense amplifier array 3, and DB1 is a data bus associated with the sense amplifier array 4, while reference numeral 6 is a data bus amplifier associated with the data bus DB0, and 7 is a data bus amplifier associated with the data bus DB1.

Further, reference numeral 8 is a column base signal generating circuit for generating a column base signal CEP, and 9 is a column address predecoder for predecoding a column address signal by using the column base signal CEP as a timing signal, and for outputting a column address predecode signal to the column decoder 5. Reference numeral 10 is a data bus amplifier enable signal generating circuit for generating a data bus enable signal DBE for the activation of the data bus amplifiers 6 and 7 by taking the column base signal CEP as an input.

In the thus constructed SDRAM, when the column base signal generating circuit 8 generates a column base signal CEP, the column address predecoder 9 predecodes the column address signal and outputs a column address predecode signal, whereupon the column decoder 5 decodes the column address predecode signal and outputs a column select signal CL to select a column.

Further, the column base signal CEP generated by the column base signal generating circuit 8 is also supplied to the data bus amplifier enable signal generating circuit 10 which thus generates the data bus amplifier enable signal DBE to activate the data bus amplifiers 6 and 7.

Here, the data bus amplifier enable signal DBE must be generated after the potentials of the data buses DB0 and DB1 have been changed enough to allow the read data read out of the column selected by the column select signal CL to be amplified sufficiently by the data bus amplifiers 6 and 7. FIG. 26A shows the target generation timings for the column select signal CL and data bus amplifier enable signal DBE.

In this SDRAM, to meet the above requirement, timing adjusting circuitry has been provided within the data bus amplifier enable signal generating circuit 10 to adjust the generating timing of the data bus amplifier enable signal DBE.

In the prior art SDRAM described above, signal path A leading from the column base signal generating circuit 8 to the point where the column selection is effected is different from signal path B leading from the column base signal generating circuit 8 to the point where the activation of the data bus amplifiers 6 and 7 is effected, and the delay times through the signal paths A and B may change because of manufacturing variations, etc.

In the worst case, the generation of the data bus amplifier enable signal DBE may occur earlier than the generation of the column select signal CL, as shown in FIG. 26B, resulting in an erroneous data read.

Therefore, a large margin has had to be allowed for the generation timing of the data bus amplifier enable signal. This has imposed a limit on the operating frequency, rendering it impossible to operate the SDRAM synchronously with a high-speed clock.

Referring now to FIGS. 1 to 24, first to fourth embodiments of the semiconductor memory device and the data bus amplifier activation method for the semiconductor device according to the present invention will be described below, dealing with examples in which the present invention is applied to an SDRAM and a data bus amplifier activation method for the SDRAM.

First, a description will be given of the first embodiment of the present invention by referring to FIGS. 1 to 10.

Figure 1:
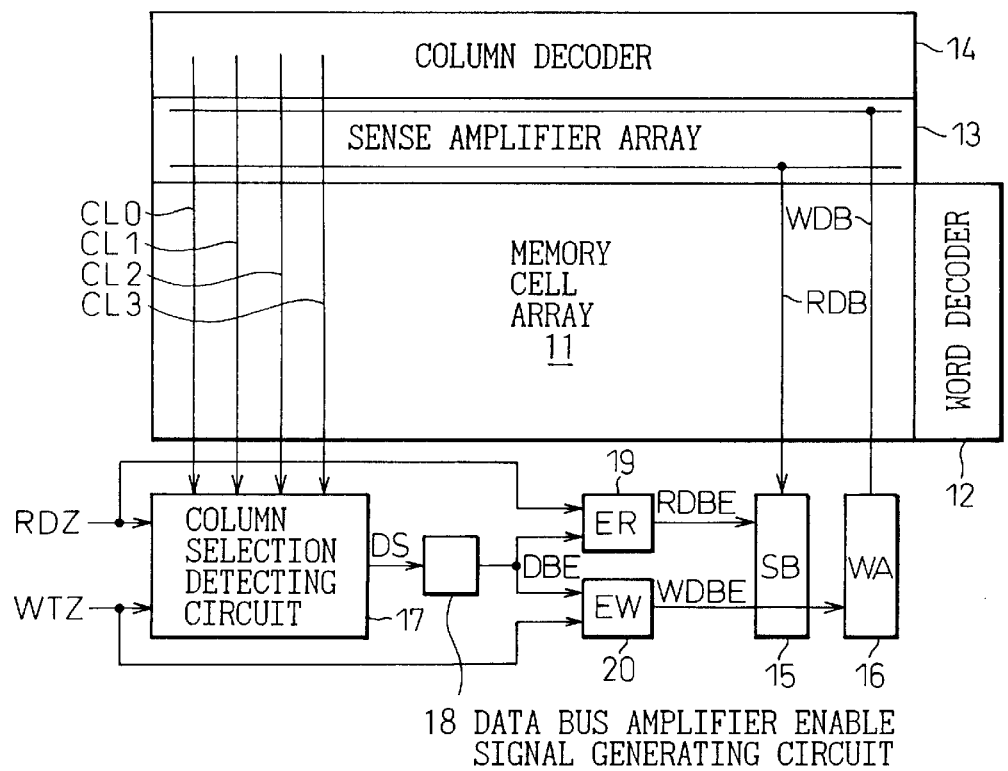
FIG. 1 is a conceptual diagram showing an essential portion of a semiconductor memory device according to a first embodiment of the present invention.

FIG. 1 is a conceptual diagram showing an essential portion of a semiconductor memory device according to the first embodiment of the present invention. In FIG. 1, reference numeral 11 is a memory cell array containing memory cells, 12 is a word decoder for selecting a word line, and 13 is a sense amplifier array containing sense amplifiers. Reference numeral 14 is a column decoder for selecting a designated column by outputting one of column select signals CL0 to CL3, RDB is a read data bus associated with the sense amplifier array 13, and WDB is a write data bus associated with the sense amplifier array 13.

Further, reference numeral 15 is a read data bus amplifier (SB) for amplifying the read data output on the read data bus RDB, and 16 is a write data bus amplifier (WA) for outputting write data on the write data bus WDB. Reference character RDZ is a state indicating signal indicating whether or not a read operation is taking place, and is set to a high level when in a read operation and to a low level when not in a read operation. Reference character WTZ is a state indicating signal indicating whether or not a write operation is taking place, and is set to a high level when in a write operation and to a low level when not in a write operation.

Reference numeral 17 is a column selection detecting circuit for taking as inputs the state indicating signals RDZ and WTZ and column select signals CL0 to CL3, and for detecting the selection of a column effected by the column decoder 14, and DS is a column selection detection signal that is output from the column selection detecting circuit 17. Reference numeral 18 is a data bus amplifier enable signal generating circuit for taking the column selection detection signal DS as an input, and for outputting a data bus amplifier enable signal DBE forming an amplifier enable base signal.

Further, reference numeral 19 is a read data bus amplifier enable signal generating circuit (ER) for taking as inputs the state indicating signal RDZ and data bus amplifier enable signal DBE, and for generating a read data bus amplifier enable signal RDBE to activate the read data bus amplifier 15. Reference numeral 20 is a write data bus amplifier enable signal generating circuit (EW) for taking as inputs the state indicating signal WTZ and data bus amplifier enable signal DBE, and for generating a write data bus amplifier enable signal WDBE to activate the write data bus amplifier 16.

The column selection detecting circuit 17, the data bus amplifier enable signal generating circuit 18, the read data bus amplifier enable signal generating circuit 19, and the write data bus amplifier enable signal generating circuit 20 together constitute a column selection detecting/data bus amplifier activating circuit for detecting the selection of a column effected by the column decoder 14 and activating the read data bus amplifier 15 or the write data bus amplifier 16.

Here, the data bus amplifier enable signal generating circuit 18, the read data bus amplifier enable signal generating circuit 19, and the write data bus amplifier enable signal generating circuit 20 together constitute a data bus amplifier activating circuit for activating the read data bus amplifier 15 and the write data bus amplifier 16.

Figure 2:
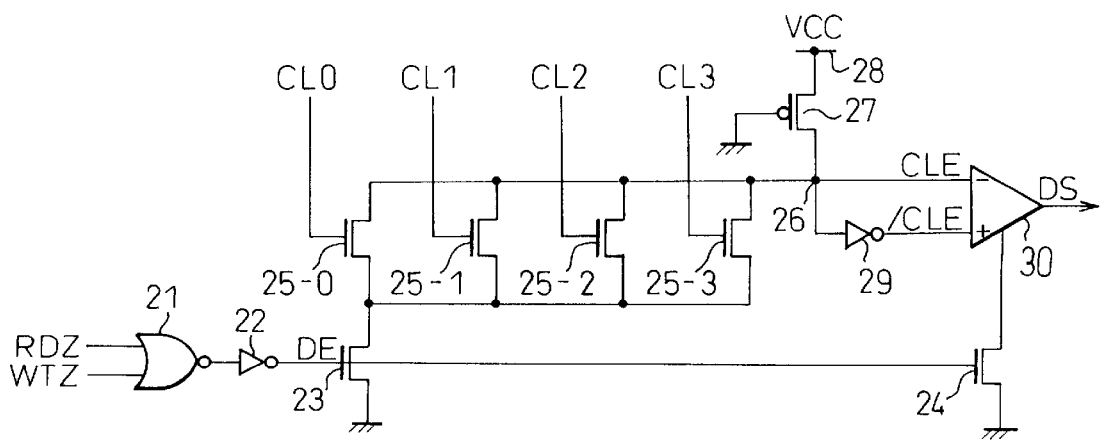
FIG. 2 is a circuit diagram showing the configuration of a column selection detecting circuit provided in the semiconductor memory device of the first embodiment.

FIG. 2 is a circuit diagram showing the configuration of the column selection detecting circuit 17. In FIG. 2, reference numeral 21 is a NOR circuit for NORing the state indicating signals RDZ and WTZ, 22 is an inverter for outputting a column selection detecting circuit enable signal DE by inverting the output of the NOR circuit 21, and 23 and 24 are nMOS transistors whose on/off operations are controlled by the column selection detecting circuit enable signal DE. Reference numerals 25-0 to 25-3 are nMOS transistors whose on/off operations are controlled by the respective column select signals CL0 to CL3. The drains of the NMOS transistors 25-0 to 25-3 are connected to a node 26, their sources are connected to the drain of the nMOS transistor 23, and their gates are respectively connected to column select lines on which the column select signals CL0 to CL3, respectively, are output. The nMOS transistors 25-0 to 25-3 thus form a wired-OR circuit.

Reference numeral 27 is a pMOS transistor which is made to function as a resistor. The source of the pMOS transistor 27 is connected to a VCC power supply line 28, its gate is connected to ground, and its drain is connected to the node 26, so that a column select signal generation detection signal CLE can be obtained by detecting at the node 26 the generation of any one of the column select signals CL0 to CL3.

Reference numeral 29 is an inverter for outputting an inverted column select signal generation detection signal /CLE by inverting the column select signal generation detection signal CLE, and 30 is an operational amplifier for taking as inputs the column select signal generation detection signal CLE and inverted column select signal generation detection signal /CLE, and for outputting the column selection detection signal DS by being activated by the nMOS transistor 24.

Figure 3:
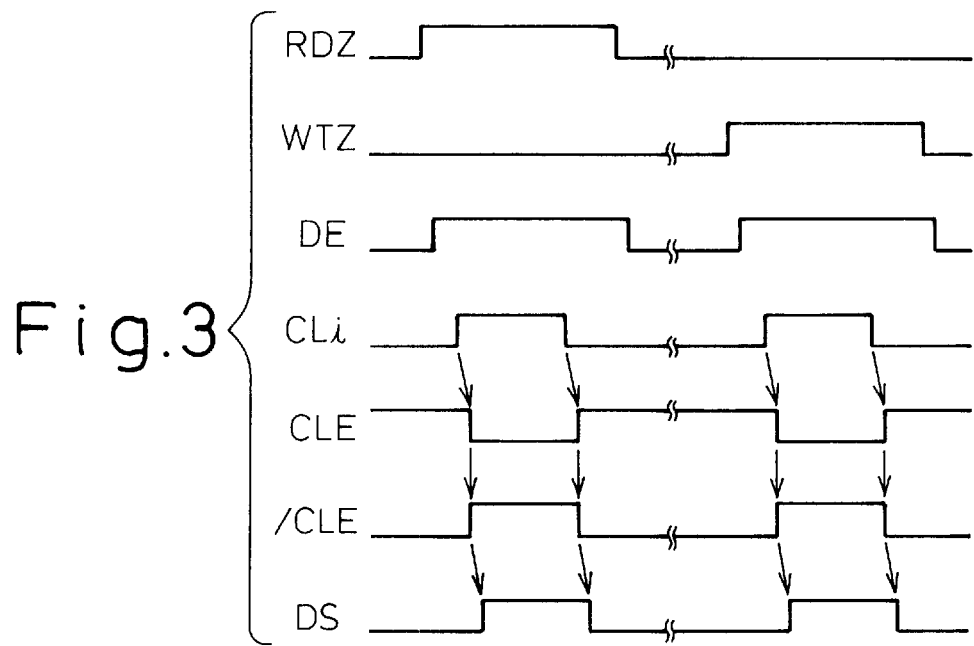
FIG. 3 is a waveform diagram illustrating the operation of the column selection detecting circuit provided in th semiconductor memory device of the first embodiment.

FIG. 3 is a waveform diagram illustrating the operation of the column selection detecting circuit 17. As shown, when the state indicating signals RDZ and WTZ are both low, the column selection detecting circuit enable signal DE is low and the nMOS transistors 23 and 24 are OFF, so that the column selection detecting circuit 17 is deactivated.

On the other hand, when one or the other of the state indicating signals, RDZ or WTZ, goes high, the column selection detecting circuit enable signal DE goes high and nMOS transistors 23 and 24 are ON, so that the column selection detecting circuit 17 is activated.

In this condition, when any one of the column select signals CL0 to CL3 goes high, then the corresponding nMOS transistor 25-i is turned on, the column select signal generation detection signal CLE goes low, the inverted column select signal generation detection signal /CLE goes high, and the column selection detection signal DS goes high.

In this way, in the column selection detecting circuit 17, when any one of the column select signals CL0 to CL3 goes to a high level in a read or write operation, the column selection detection signal DS goes to a high level; thereafter, when the column select signal CLi goes from high to low, the column selection detection signal DS goes to a low level.

Figure 4:
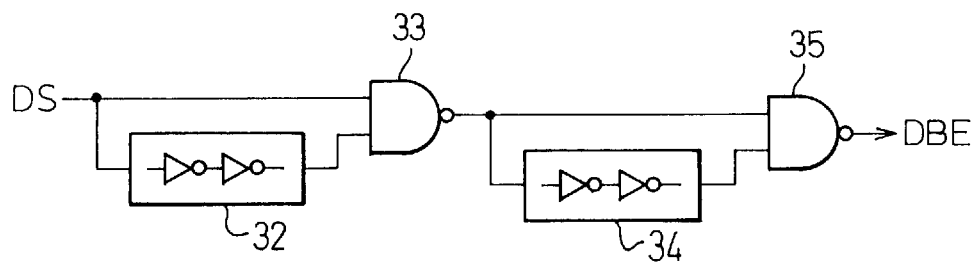
FIG. 4 is a circuit diagram showing a first configurational example of a data bus amplifier enable signal generating circuit provided in the semiconductor memory device of the first embodiment.

FIG. 4 is a circuit diagram showing a first configurational example of the data bus amplifier enable signal generating circuit 18. In FIG. 4, reference numeral 32 is a variable delay circuit whose delay time is adjustable for delaying the column selection detection signal DS, and 33 is a NAND circuit for NANDing the column selection detection signal DS with the output of the variable delay circuit 32. Further, reference numeral 34 is a variable delay circuit whose delay time is adjustable for delaying the output produced by the NAND circuit 33, and 35 is a NAND circuit for NANDing the output of the NAND circuit 33 with the output of the variable delay circuit 34 to output the data bus amplifier enable signal DBE.

Figure 5:
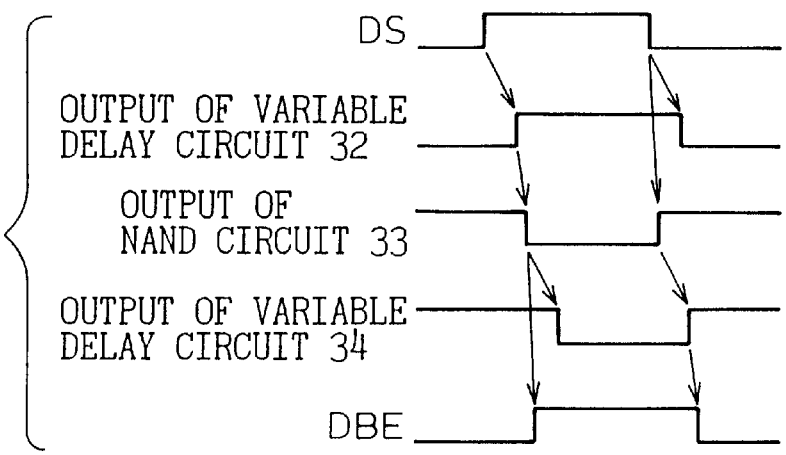
FIG. 5 is a waveform diagram illustrating the operation of the first configurational example of the data bus amplifier enable signal generating circuit provided in the semiconductor memory device of the first embodiment.

FIG. 5 is a waveform diagram illustrating the operation of the first configurational example of the read data bus amplifier enable signal generating circuit 18. In this example, the data bus amplifier enable signal DBE is generated with a delay equal to the combined delay time of the variable delay circuit 32 and NAND circuits 33 and 35 from the time that the column selection detection signal DS is generated, and is deactivated thereafter with a delay equal to the combined delay time of the NAND circuit 33, variable delay circuit 34, and NAND circuit 35 from the time that the column selection detection signal DS is deactivated.

That is, in this example, the generation timing of the data bus amplifier enable signal DBE is determined relative to the generation timing of the column selection detection signal DS, and the deactivation timing of the data bus amplifier enable signal DBE is determined relative to the deactivation timing of the column selection detection signal DS.

Accordingly, the generation timing of the data bus amplifier enable signal DBE can be adjusted by adjusting the delay time in the variable delay circuit 32, and the deactivation timing of the data bus amplifier enable signal DBE can be adjusted by adjusting the delay time in the variable delay circuit 34.

Figure 6:
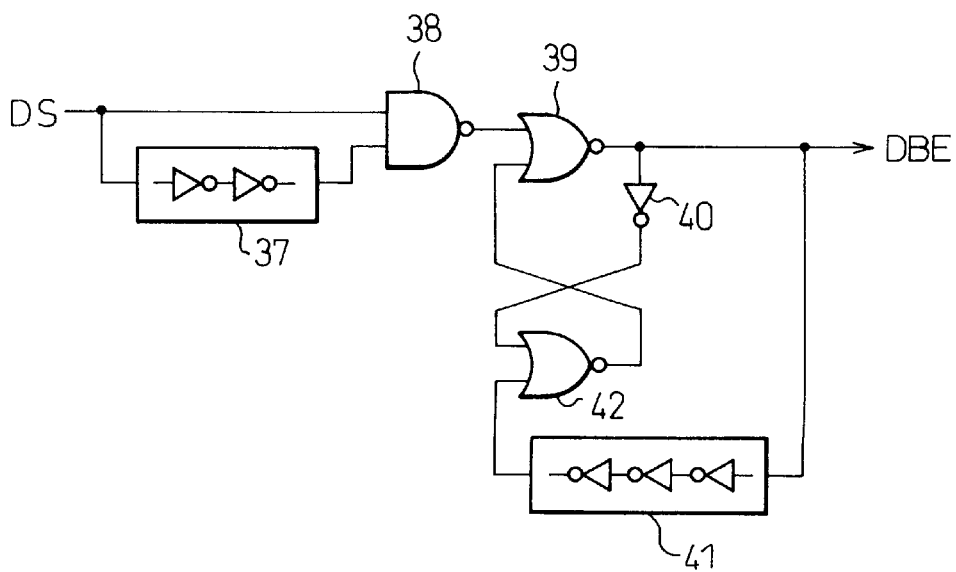
FIG. 6 is a circuit diagram showing a second configurational example of the data bus amplifier enable signal generating circuit provided in the semiconductor memory device of the first embodiment.

FIG. 6 is a circuit diagram showing a second configurational example of the data bus amplifier enable signal generating circuit 18. In FIG. 6, reference numeral 37 is a variable delay circuit whose delay time is adjustable for delaying the column selection detection signal DS, and 38 is a NAND circuit for NANDing the column selection detection signal DS with the output of the variable delay circuit 37. Reference numeral 39 is a NOR circuit whose first input terminal is coupled to the output terminal of the NAND circuit 38, and which outputs the data bus amplifier enable signal DBE, and 40 is an inverter for inverting the data bus amplifier enable signal DBE. Further, reference numeral 41 is a variable inverting delay circuit whose delay time is adjustable for inverting and delaying the data bus amplifier enable signal DBE, and 42 is a NOR circuit for NORing the output of the inverter 40 with the output of the variable inverting delay circuit 41, the output terminal of the NOR circuit 42 being coupled to the second input terminal of the NOR circuit 39.

Figure 7:
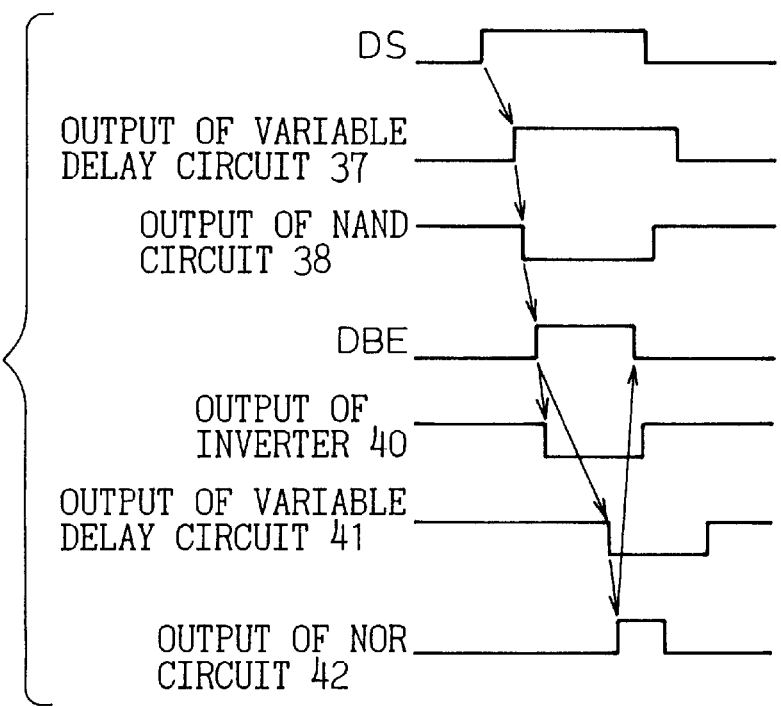
FIG. 7 is a waveform diagram illustrating the operation of the second configurational example of the data bus amplifer enable signal generating circuit provided in the semiconductor memory device of the first embodiment.

FIG. 7 is a waveform diagram illustrating the operation of the second configurational example of the read data bus amplifier enable signal generating circuit 18. In this example, the data bus amplifier enable signal DBE is generated with a delay equal to the combined delay time of the variable delay circuit 37, NAND circuits 38, and NOR circuit 39 from the time that the column selection detection signal DS is generated, and thereafter, the data bus amplifier enable signal DBE is deactivated with a delay equal to the combined delay time of the variable delay circuit 41 and NOR circuits 42 and 39.

That is, in this example, the generation and deactivation timings of the data bus amplifier enable signal DBE are determined relative to the generation timing of the column selection detection signal DS.

Accordingly, the generation timing of the data bus amplifier enable signal DBE can be adjusted by adjusting the delay time in the variable delay circuit 37, and the deactivation timing of the data bus amplifier enable signal DBE can be adjusted by adjusting the delay time in the variable delay circuit 41.

Figure 8:
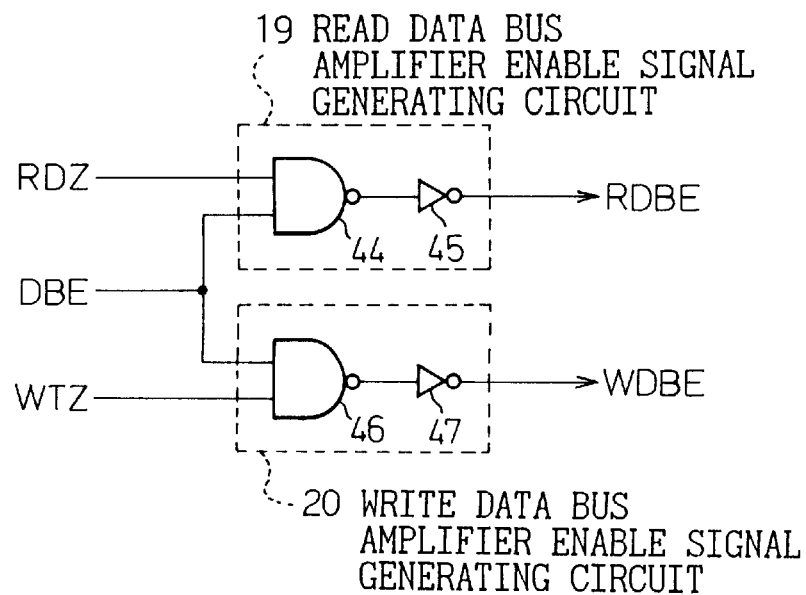
FIG. 8 is a circuit diagram showing the configuration of a read data bus amplifier enable signal generating circuit and write data bus amplifier enable signal generating circuit provided in the semiconductor memory device of the first embodiment.

FIG. 8 is a circuit diagram showing the configuration of the read data bus amplifier enable signal generating circuit 19 and write data bus amplifier enable signal generating circuit 20. In the read data bus amplifier enable signal generating circuit 19 shown in FIG. 8, reference numeral 44 is a NAND circuit for NANDing the state indicating signal RDZ with the data bus amplifier enable signal DBE, and 45 is an inverter for outputting the read data bus amplifier enable signal RDBE by inverting the output of the NAND circuit 44.

In the write data bus amplifier enable signal generating circuit 20, reference numeral 46 is a NAND circuit for NANDing the state indicating signal WTZ with the data bus amplifier enable signal DBE, and 47 is an inverter for outputting the write data bus amplifier enable signal WDBE by inverting the output of the NAND circuit 46.

Figure 9:
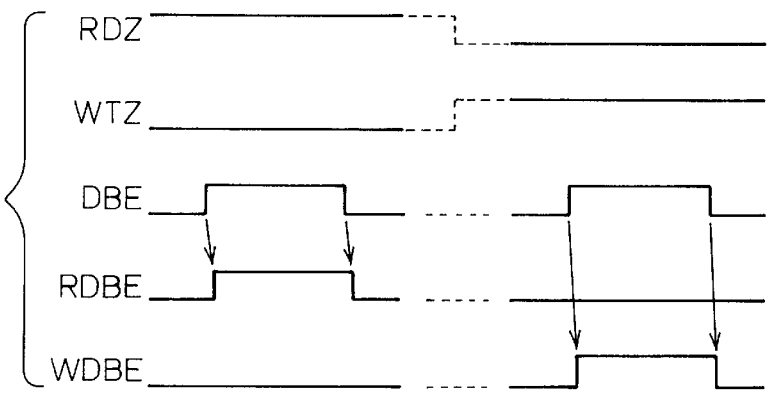
FIG. 9 is a waveform diagram illustrating the operation of the read data bus amplifier enable signal generating circuit and write data bus amplifier enable signal generating circuit provided in the semiconductor memory device of the first embodiment.

FIG. 9 is a waveform diagram illustrating the operation of the read data bus amplifier enable signal generating circuit 19 and write data bus amplifier enable signal generating circuit 20. In this example, the read data bus amplifier enable signal RDBE is generated when the data bus amplifier enable signal DBE occurs during the period that the state indicating signal RDZ is high (indicating a read operation); thereafter, when the data bus amplifier enable signal DBE is deactivated, the read data bus amplifier enable signal RDBE is also deactivated.

Accordingly, when the first configurational example is employed for the data bus amplifier enable signal generating circuit 18, the generation timing of the read data bus amplifier enable signal RDBE is determined relative to the generation timing of the column selection detection signal DS, and the deactivation timing of the read data bus amplifier enable signal RDBE is determined relative to the deactivation timing of the column selection detection signal DS.

On the other hand, when the second configurational example is employed for the data bus amplifier enable signal generating circuit 18, the generation and deactivation timings of the read data bus amplifier enable signal RDBE are determined relative to the generation timing of the column selection detection signal DS.

The write data bus amplifier enable signal WDBE is generated when the data bus amplifier enable signal DBE occurs during the period that the state indicating signal WTZ is high (indicating a write operation), and is deactivated thereafter when the data bus amplifier enable signal DBE is deactivated.

Accordingly, when the first configurational example is employed for the data bus amplifier enable signal generating circuit 18, the generation timing of the write data bus amplifier enable signal WDBE is determined relative to the generation timing of the column selection detection signal DS, and the deactivation timing of the write data bus amplifier enable signal WDBE is determined relative to the deactivation timing of the column selection detection signal DS.

On the other hand, when the second configurational example is employed for the data bus amplifier enable signal generating circuit 18, the generation and deactivation timings of the write data bus amplifier enable signal WDBE are determined relative to the generation timing of the column selection detection signal DS.

Figure 10:
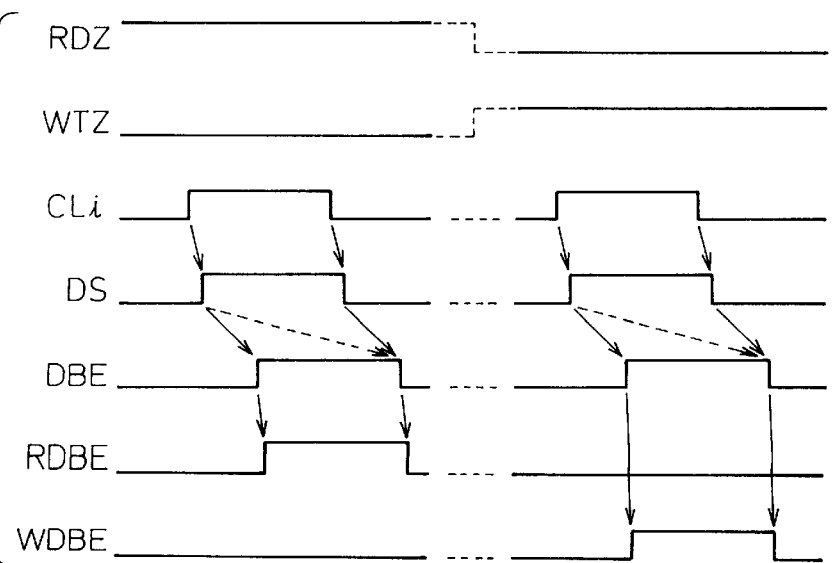
FIG. 10 is a waveform diagram for explaining the operation of the semiconductor memory device according to the first embodiment of the present invention.

FIG. 10 is a waveform diagram for explaining the operation of the semiconductor memory device according to the first embodiment of the present invention. As shown, in the first embodiment of the semiconductor memory device of the present invention, when column select signal CLi, i.e., any one of the column select signals CL1 to CL3, occurs during the period that the state indicating signal RDZ is high (indicating a read operation), the column selection detection signal DS is generated, as a result of which the data bus amplifier enable signal DBE is generated and hence, the read data bus amplifier enable signal RDBE is generated.

Likewise, when column select signal CLi, i.e., any one of the column select signals CL0 to CL3, occurs during the period that the state indicating signal WTZ is high (indicating a write operation), the column selection detection signal DS is generated, as a result of which the data bus amplifier enable signal DBE is generated and hence, the write data bus amplifier enable signal WDBE is generated.

In this way, in the first embodiment of the semiconductor memory device of the present invention, since provisions are made to generate the read data bus amplifier enable signal RDBE or the write data bus amplifier enable signal WDBE by detecting the selection of a column effected by the column decoder 14, the read data bus amplifier enable signal RDBE and the write data bus amplifier enable signal WDBE are both prevented from being generated before one of the column select signals CL0 to CL3 is generated, and under any conditions, either enable signal is generated only after one of the column select signals CL0 to CL3 has been generated.

Therefore, according to the first embodiment of the semiconductor memory device of the present invention, there is no need to allow a large margin for the generation timing of the read data bus amplifier enable signal RDBE or the write data bus amplifier enable signal WDBE. This permits faster operating speed for the SDRAM where the read data bus RDB for data reading and the write data bus WDB for data writing are provided separately.

Furthermore, in the first embodiment of the semiconductor memory device of the present invention, the column decoder 14 and the column selection detecting circuit 17 are disposed opposite each other across the memory cell array 11. This arrangement serves to simplify the timing design since the generation of a column select signal can be detected at a point where the activation of the column select line is the most delayed, thus eliminating the need to consider the propagation delay through the column select line.

Next, the second embodiment of the present invention will be described with reference to FIGS. 11 to 13.

Figure 11:
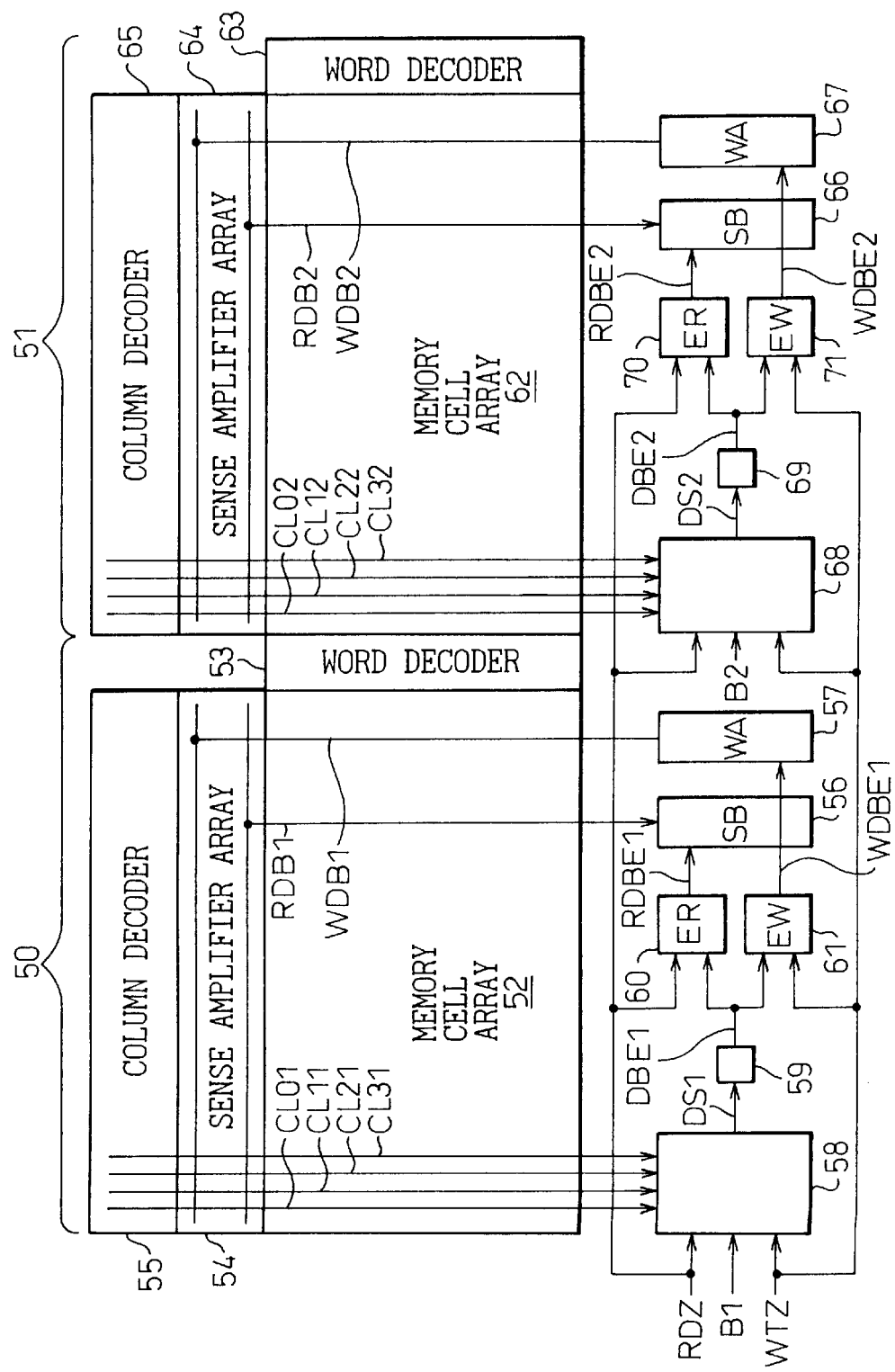
FIG. 11 is a conceptual diagram showing an essential portion of a semiconductor memory device according to a second embodiment of the present invention.

FIG. 11 is a conceptual diagram showing an essential portion of a semiconductor memory device according to the second embodiment of the present invention. In FIG. 11, reference numerals 50 and 51 are memory blocks, B1 is a memory block selection signal for selecting the memory block 50, and B2 is a memory block selection signal for selecting the memory block 51.

In the memory block 50, reference numeral 52 is a memory cell array containing memory cells, 53 is a word decoder for selecting a word line, and 54 is a sense amplifier array containing sense amplifiers. Further, reference numeral 55 is a column decoder forming a column selection circuit for selecting a designated column by outputting one of column select signals CL01 to CL31, RDB1 is a read data bus associated with the sense amplifier array 54 and dedicated to data reading, and WDB1 is a write data bus associated with the sense amplifier array 54 and dedicated to data writing.

Reference numeral 56 is a read data bus amplifier (SB) for amplifying the read data output on the read data bus RDB1, and 57 is a write data bus amplifier (WA) for outputting write data on the write data bus WDB1. Reference character RDZ is a state indicating signal indicating whether or not a read operation is taking place, and is set to a high level when in a read operation and to a low level when not in a read operation. Reference character WTZ is a state indicating signal indicating whether or not a write operation is taking place, and is set to a high level when in a write operation and to a low level when not in a write operation.

Reference numeral 58 is a column selection detecting circuit for taking as inputs the state indicating signals RDZ and WTZ and column select signals CL01 to CL31, and for detecting the selection of a column effected by the column decoder 55, DS1 is a column selection detection signal that is output from the column selection detecting circuit 58, and 59 is a data bus amplifier enable signal generating circuit for taking the column selection detection signal DS1 as an input, and for outputting a data bus amplifier enable signal DBE1 forming a data bus amplifier enable base signal. Further, reference numeral 60 is a read data bus amplifier enable signal generating circuit (ER) for taking as inputs the state indicating signal RDZ and data bus amplifier enable signal DBE1, and for generating a read data bus amplifier enable signal RDBE1 to activate the read data bus amplifier 56. Reference numeral 61 is a write data bus amplifier enable signal generating circuit (EW) for taking as inputs the state indicating signal WTZ and data bus amplifier enable signal DBE1, and for generating a write data bus amplifier enable signal WDBE1 to activate the write data bus amplifier 57.

In the memory block 51, reference numeral 62 is a memory cell array containing memory cells, 63 is a word decoder for selecting a word line, and 64 is a sense amplifier array containing sense amplifiers.

Reference numeral 65 is a column decoder forming a column selection circuit for selecting a designated column by outputting one of column select signals CL02 to CL32, RDB2 is a read data bus associated with the sense amplifier array 64 and dedicated to data reading, and WDB2 is a write data bus associated with the sense amplifier array 64 and dedicated to data writing.

Reference numeral 66 is a read data bus amplifier (SB) for amplifying the read data output on the read data bus RDB2, and 67 is a write data bus amplifier (WA) for outputting write data on the write data bus WDB2. Reference numeral 68 is a column selection detecting circuit for taking as inputs the state indicating signals RDZ and WTZ and column select signals CL02 to CL32, and for detecting the selection of a column effected by the column decoder 65, DS2 is a column selection detection signal that is output from the column selection detecting circuit 68, and 69 is a data bus amplifier enable signal generating circuit for taking the column selection detection signal DS2 as an input, and for outputting a data bus amplifier enable signal DBE2 forming a data bus amplifier enable base signal.

Further, reference numeral 70 is a read data bus amplifier enable signal generating circuit (ER) for taking as inputs the state indicating signal RDZ and data bus amplifier enable signal DBE2, and for generating a read data bus amplifier enable signal RDBE2 to activate the read data bus amplifier 66. Reference numeral 71 is a write data bus amplifier enable signal generating circuit (EW) for taking as inputs the state indicating signal WTZ and data bus amplifier enable signal DBE2, and for generating a write data bus amplifier enable signal WDBE2 to activate the write data bus amplifier 67.

The column selection detecting circuit 58, the data bus amplifier enable signal generating circuit 59, the read data bus amplifier enable signal generating circuit 60, and the write data bus amplifier enable signal generating circuit 61 together constitute a column selection detecting/data bus amplifier activating circuit for detecting the selection of a column effected by the column decoder 55 and activating the read data bus amplifier 56 or the write data bus amplifier 57.

Here, the data bus amplifier enable signal generating circuit 59, the read data bus amplifier enable signal generating circuit 60, and the write data bus amplifier enable signal generating circuit 61 together constitute a data bus amplifier activating circuit for activating the read data bus amplifier 56 and the write data bus amplifier 57. Further, the column selection detecting circuit 68, the data bus amplifier enable signal generating circuit 69, the read data bus amplifier enable signal generating circuit 70, and the write data bus amplifier enable signal generating circuit 71 together constitute a column selection detecting/data bus amplifier activating circuit for detecting the selection of a column effected by the column decoder 65 and activating the read data bus amplifier 66 or the write data bus amplifier 67.

Here, the data bus amplifier enable signal generating circuit 69, the read data bus amplifier enable signal generating circuit 70, and the write data bus amplifier enable signal generating circuit 71 together constitute a data bus amplifier activating circuit for activating the read data bus amplifier 66 and the write data bus amplifier 67.

The memory cell arrays 52 and 62, word decoders 53 and 63, sense amplifiers 54 and 64, column decoders 55 and 65, read data bus amplifiers 56 and 66, and write data bus amplifiers 57 and 67 described above are respectively identical in configuration to the memory cell array 11, word decoder 12, sense amplifier array 13, column decoder 14, read data bus amplifier 15, and write data bus amplifier 16 provided in the semiconductor memory device of the first embodiment of the present invention.

Further, the data bus amplifier enable signal generating circuits 59 and 69, read data bus amplifier enable signal generating circuits 60 and 70, and write data bus amplifier enable signal generating circuits 61 and 71 described above are respectively identical in configuration to the data bus amplifier enable signal generating circuit 18, read data bus amplifier enable signal generating circuit 19, and write data bus amplifier enable signal generating circuit 20 provided in the semiconductor memory device of the first embodiment of the present invention.

Figure 12:
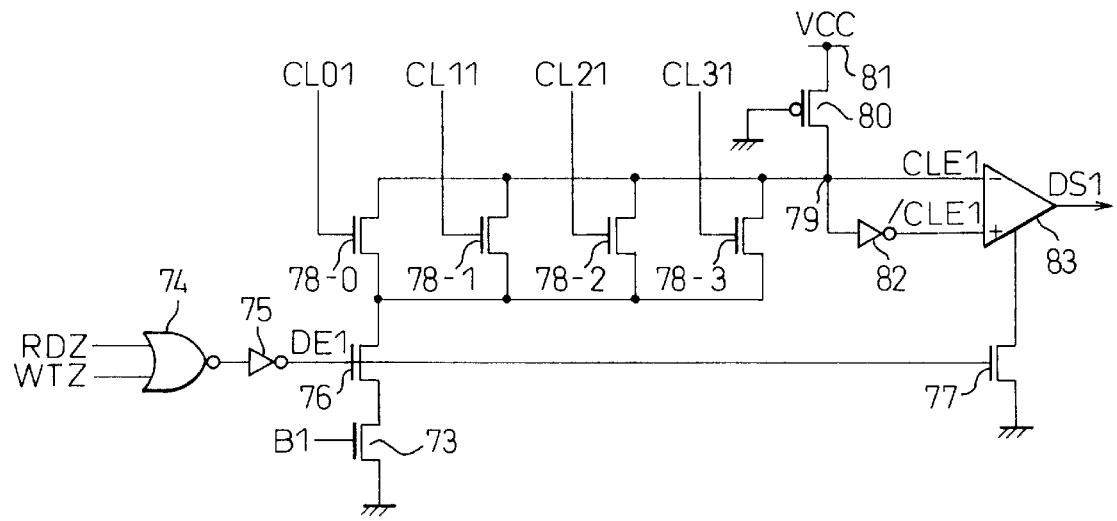
FIG. 12 is a circuit diagram showing the configuration of a column selection detecting circuit provided in the semiconductor memory device of the second embodiment.

FIG. 12 is a circuit diagram showing the configuration of the column selection detecting circuit 58. In FIG. 12, reference numeral 73 is an NMOS transistor whose on/off operations are controlled by the memory block selection signal B1, 74 is a NOR circuit for NORing the state indicating signals RDZ and WTZ, 75 is an inverter for outputting a column selection detecting circuit enable signal DE1 by inverting the output of the NOR circuit 74, and 76 and 77 are nMOS transistors whose on/off operations are controlled by the column selection detecting circuit enable signal DE1.

Reference numerals 78-0 to 78-3 are nMOS transistors whose on/off operations are controlled by the respective column select signals CL01 to CL31. The drains of the NMOS transistors 78-0 to 78-3 are connected to a node 79, their sources are connected to the drain of the nMOS transistor 76, and their gates are respectively connected to column select lines on which the column select signals CL01 to CL31, respectively, are output. The nMOS transistors 78-0 to 78-3 thus form a wired-OR circuit. Further, reference numeral 80 is a pMOS transistor which is made to function as a resistor. The source of the pMOS transistor 80 is connected to a VCC power supply line 81, its gate is connected to ground, and its drain is connected to the node 79, so that a column select signal generation detection signal CLE1 can be obtained by detecting at the node 79 the generation of any one of the column select signals CL01 to CL31.

Reference numeral 82 is an inverter for outputting an inverted column select signal generation detection signal /CLE1 by inverting the column select signal generation detection signal CLE1, and 83 is an operational amplifier for taking as inputs the column select signal generation detection signal CLE1 and inverted column select signal generation detection signal /CLE1, and for outputting the column selection detection signal DS1 by being activated by the nMOS transistor 77.

As described above, the column selection detecting circuit 58 is the same in configuration as the column selection detecting circuit 17 provided in the semiconductor memory device of the first embodiment of the present invention, except for the provision of the nMOS transistor 73 whose on/off operations are controlled by the memory block selection signal B1; accordingly, when the memory block selection signal B1 is set to a high level, and the nMOS transistor 73 is ON, the column selection detecting circuit 58 operates in the same way as the column selection detecting circuit 17.

Figure 13:
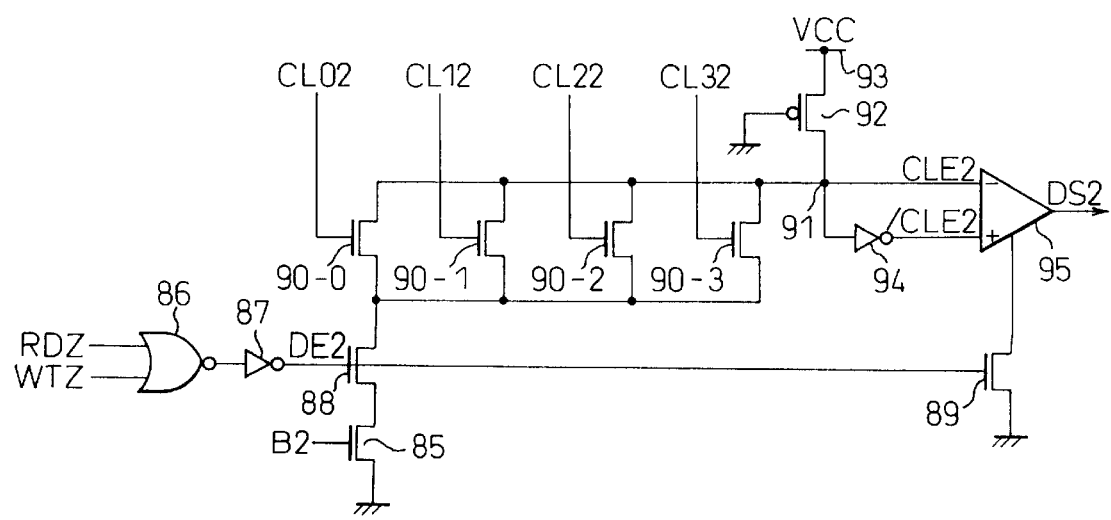
FIG. 13 is a waveform diagram illustrating the configuration of a column selection detecting circuit provided in the semiconductor memory device of the second embodiment.

FIG. 13 is a circuit diagram showing the configuration of the column selection detecting circuit 68. In FIG. 13, reference numeral 85 is an nMOS transistor whose on/off operations are controlled by the memory block selection signal B2, 86 is a NOR circuit for NORing the state indicating signals RDZ and WTZ, 87 is an inverter for outputting a column selection detecting circuit enable signal DE2 by inverting the output of the NOR circuit 86, and 88 and 89 are nMOS transistors whose on/off operations are controlled by the column selection detecting circuit enable signal DE2. Reference numerals 90-0 to 90-3 are NMOS transistors whose on/off operations are controlled by the respective column select signals CL02 to CL32. The drains of the nMOS transistors 90-0 to 90-3 are connected to a node 91, their sources are connected to the drain of the nMOS transistor 88, and their gates are respectively connected to column select lines on which the column select signals CL02 to CL32, respectively, are output. The nMOS transistors 90-0 to 90-3 thus form a wired-OR circuit.

Reference numeral 92 is a pMOS transistor which is made to function as a resistor. The source of the pMOS transistor 92 is connected to a VCC power supply line 93, its gate is connected to ground, and its drain is connected to the node 91, so that a column select signal generation detection signal CLE2 can be obtained by detecting at the node 91 the generation of any one of the column select signals CL02 to CL32. Further, reference numeral 94 is an inverter for outputting an inverted column select signal generation detection signal /CLE2 by inverting the column select signal generation detection signal CLE2, and 95 is an operational amplifier for taking as inputs the column select signal generation detection signal CLE2 and inverted column select signal generation detection signal /CLE2, and for outputting the column selection detection signal DS2 by being activated by the nMOS transistor 89.

As described above, the column selection detecting circuit 68 is the same in configuration as the column selection detecting circuit 17 provided in the semiconductor memory device of the first embodiment of the present invention, except for the provision of the nMOS transistor 85 whose on/off operations are controlled by the memory block selection signal B2; accordingly, when the memory block selection signal B2 is set to a high level, and the nMOS transistor 85 is ON, the column selection detecting circuit 68 operates in the same way as the column selection detecting circuit 17.

In the thus constructed semiconductor memory device of the second embodiment of the present invention, when the memory block 50 is selected, the memory block 50 operates in the same way as the semiconductor memory device of the first embodiment of the present invention, and the read data bus amplifier enable signal RDBE1 or the write data bus amplifier enable signal WDBE1 is generated by detecting the selection of a column effected by the column decoder 55.

As a result, neither the read data bus amplifier enable signal RDBE1 nor the write data bus amplifier enable signal WDBE1 is generated before one of the column select signals CL01 to CL31 is generated, and under any conditions, either enable signal is generated only after one of the column select signals CL01 to CL31 has been generated.

Similarly, when the memory block 51 is selected, the memory block 51 operates in the same way as the semiconductor memory device of the first embodiment of the present invention, and the read data bus amplifier enable signal RDBE2 or the write data bus amplifier enable signal WDBE2 is generated by detecting the selection of a column effected by the column decoder 65.

As a result, neither the read data bus amplifier enable signal RDBE2 nor the write data bus amplifier enable signal WDBE2 is generated before one of the column select signals CL02 to CL32 is generated, and under any conditions, either enable signal is generated only after one of the column select signals CL02 to CL32 has been generated.

Therefore, according to the second embodiment of the semiconductor memory device of the present invention, there is no need to allow a large margin for the generation timing of the read data bus amplifier enable signals RDBE1 and RDBE2 or the write data bus amplifier enable signals WDBE1 and WDBE2. This permits faster operating speed for the SDRAM having the two memory blocks 50 and 51 where the read data buses RDB1 and RDB2 for data reading are provided separately from the write data buses WDB1 and WDB2 for data writing.

Furthermore, in the second embodiment of the semiconductor memory device of the present invention, the column decoder 55 and the column selection detecting circuit 58 are disposed opposite each other across the memory cell array 52, and also the column decoder 65 and the column selection detecting circuit 68 are disposed opposite each other across the memory cell array 62. This arrangement serves to simplify the timing design since the generation of a column select signal can be detected at a point where the activation of the column select line is the most delayed, thus eliminating the need to consider the propagation delay through the column select line.

Next, the third embodiment of the present invention will be described with reference to FIGS. 14 to 23.

Figure 14:
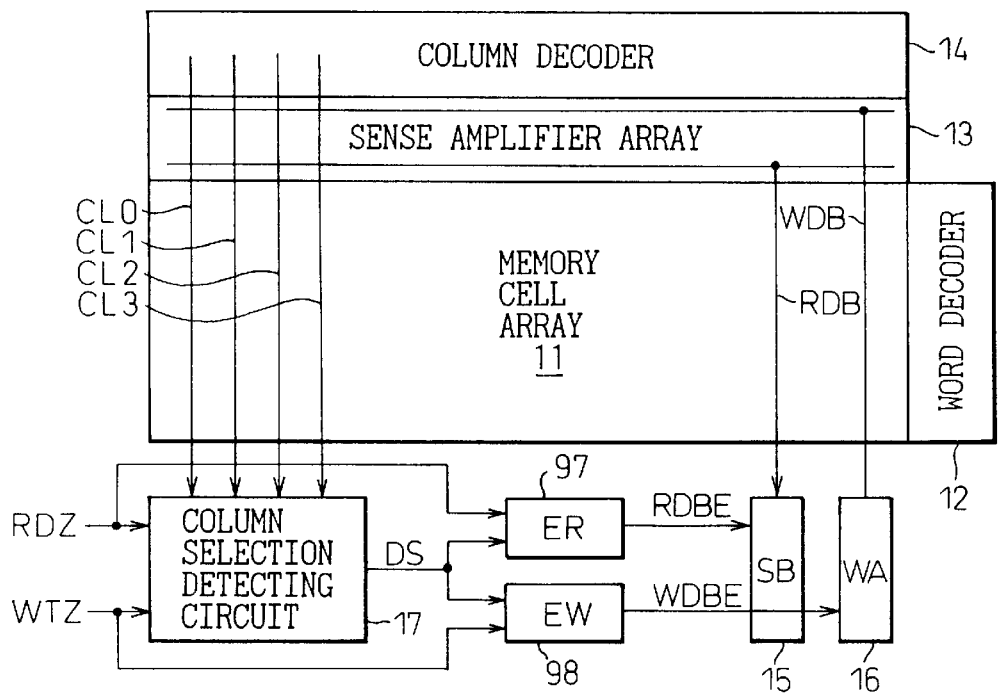
FIG. 14 is a conceptual diagram showing an essential portion of a semiconductor memory device according to a third embodiment of the present invention.

FIG. 14 is a conceptual diagram showing an essential portion of a semiconductor memory device according to the third embodiment of the present invention. In the semiconductor memory device of the third embodiment, the data bus amplifier enable signal generating circuit 18 provided in the first embodiment is omitted, and instead, a read data bus amplifier enable signal generating circuit 97 and a write data bus amplifier enable signal generating circuit 98 are provided which have circuit configurations different from those of the read data bus amplifier enable signal generating circuit 19 and write data bus amplifier enable signal generating circuit 20 of the first embodiment. Otherwise, the configuration of the semiconductor memory device of the third embodiment is the same as that of the first embodiment.

Figure 15:
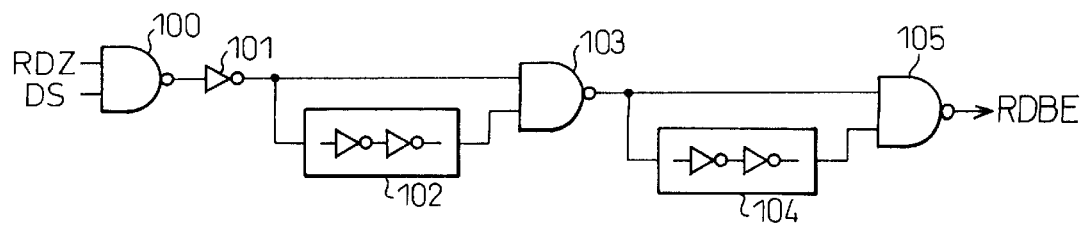
FIG. 15 is a circuit diagram showing a first configurational example of a read data bus amplifier enable signal generating circuit provided in the semiconductor memory device of the third embodiment.

FIG. 15 is a circuit diagram showing a first configurational example of the read data bus amplifier enable signal generating circuit 97. In FIG. 15, reference numeral 100 is a NAND circuit for NANDing the state indicating signal RDZ with the column selection detection signal DS, and 101 is an inverter for inverting the output of the NAND circuit 100. Further, reference numeral 102 is a variable delay circuit whose delay time is adjustable for delaying the output produced by the inverter 101, and 103 is a NAND circuit for NANDing the output of the inverter 101 with the output of the variable delay circuit 102.

Reference numeral 104 is a variable delay circuit whose delay time is adjustable for delaying the output produced by the NAND circuit 103, and 105 is a NAND circuit for outputting the read data bus amplifier enable signal RDBE by NANDing the output of the NAND circuit 103 with the output of the variable delay circuit 104.

Figure 16:
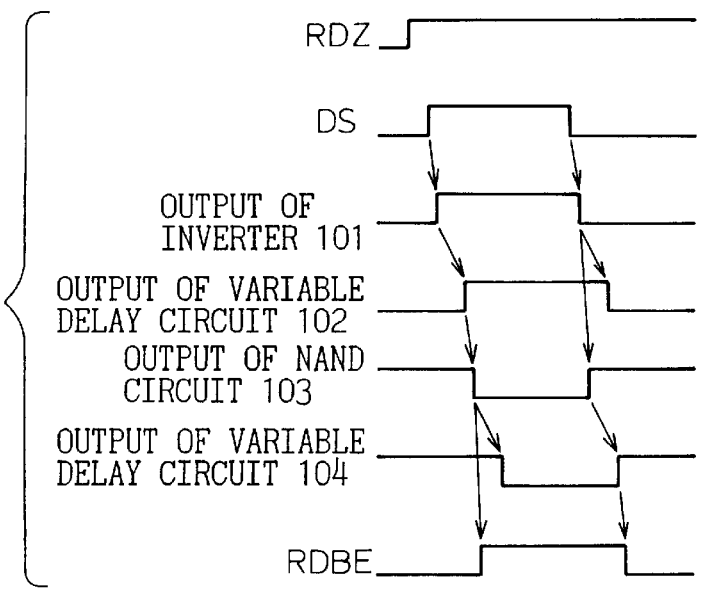
FIG. 16 is a waveform diagram illustrating the operation of the first configurational example of the read data bus amplifier enable signal generating circuit provided in the semiconductor memory device of the third embodiment.

FIG. 16 is a waveform diagram illustrating the operation of the first configurational example of the read data bus amplifier enable signal generating circuit 97. In this example, the read data bus amplifier enable signal RDBE is generated with a delay equal to the combined delay time of the NAND circuit 100, inverter 101, variable delay circuit 102, and NAND circuits 103 and 105 from the time that the column selection detection signal DS is generated, and is deactivated thereafter with a delay equal to the combined delay time of the NAND circuit 100, inverter 101, NAND circuit 103, variable delay circuit 104, and NAND circuit 105 from the time that the column selection detection signal DS is deactivated.

That is, in this example, the generation timing of the read data bus amplifier enable signal RDBE is determined relative to the generation timing of the column selection detection signal DS, and the deactivation timing of the read data bus amplifier enable signal RDBE is determined relative to the deactivation timing of the column selection detection signal DS.

Accordingly, the generation timing of the read data bus amplifier enable signal RDBE can be adjusted by adjusting the delay time in the variable delay circuit 102, and the deactivation timing of the read data bus amplifier enable signal RDBE can be adjusted by adjusting the delay time in the variable delay circuit 104.

Figure 17:
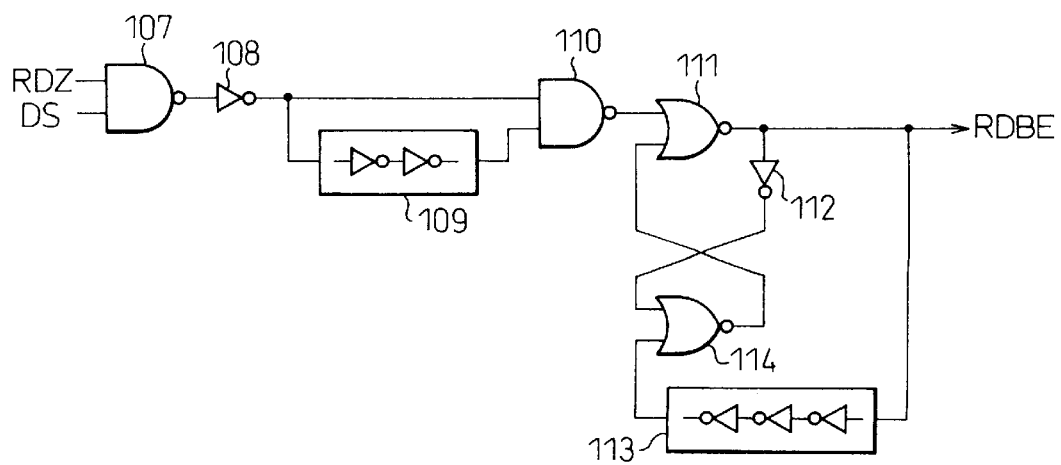
FIG. 17 is a circuit diagram showing a second configurational example of the read data bus amplifier enable signal generating circuit provided in the semiconductor memory device of the third embodiment.

FIG. 17 is a circuit diagram showing a second configurational example of the read data bus amplifier enable signal generating circuit 97. In FIG. 17, reference numeral 107 is a NAND circuit for NANDing the state indicating signal RDZ with the column selection detection signal DS, and 108 is an inverter for inverting the output of the NAND circuit 107.

Reference numeral 109 is a variable delay circuit whose delay time is adjustable for delaying the output produced by the inverter 108, and 110 is a NAND circuit for NANDing the output of the inverter 108 with the output of the variable delay circuit 109. Further, reference numeral 111 is a NOR circuit whose first input terminal is coupled to the output terminal of the NAND circuit 110, and which outputs the read data bus amplifier enable signal RDBE, and 112 is an inverter for inverting the read data bus amplifier enable signal RDBE.

Reference numeral 113 is a variable inverting delay circuit whose delay time is adjustable for inverting and delaying the read data bus amplifier enable signal RDBE, and 114 is a NOR circuit for NORing the output of the inverter 112 with the output of the variable inverting delay circuit 113, the output terminal of the NOR circuit 114 being coupled to the second input terminal of the NOR circuit 111.

Figure 18:
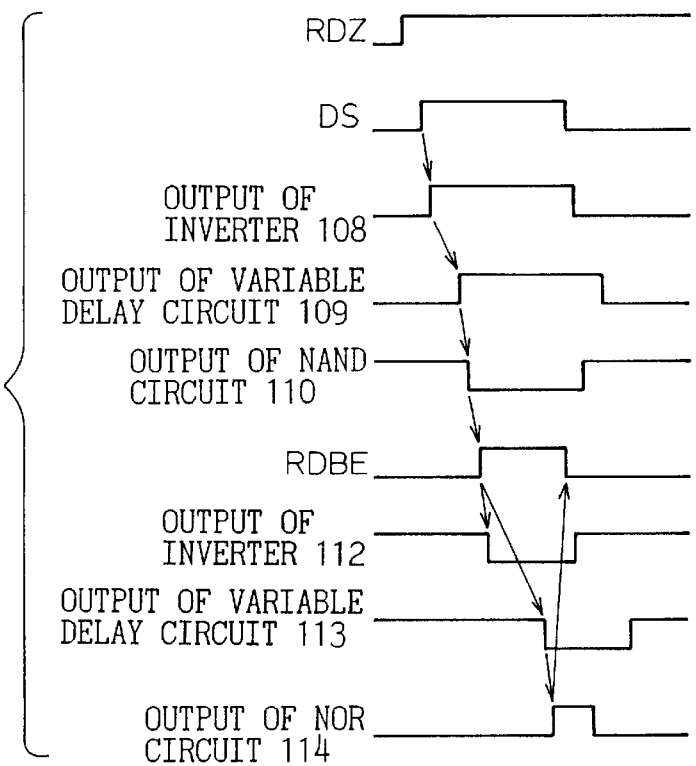
FIG. 18 is a waveform diagram illustrating the operation of the second configurational example of the read data bus amplifier enable signal generating circuit provided in the semiconductor memory device of the third embodiment.

FIG. 18 is a waveform diagram illustrating the operation of the second configurational example of the read data bus amplifier enable signal generating circuit 97. In this example, the read data bus amplifier enable signal RDBE is generated with a delay equal to the combined delay time of the NAND circuit 107, inverter 108, variable delay circuit 109, NAND circuit 110, and NOR circuit 111 from the time that the column selection detection signal DS is generated, and is deactivated thereafter with a further delay equal to the combined delay time of the variable delay circuit 113 and NOR circuits 114 and 111.

That is, in this example, the generation and deactivation timings of the read data bus amplifier enable signal RDBE are determined relative to the generation timing of the column selection detection signal DS.

Accordingly, the generation timing of the read data bus amplifier enable signal RDBE can be adjusted by adjusting the delay time in the variable delay circuit 109, and the deactivation timing of the read data bus amplifier enable signal RDBE can be adjusted by adjusting the delay time in the variable delay circuit 113.

Figure 19:
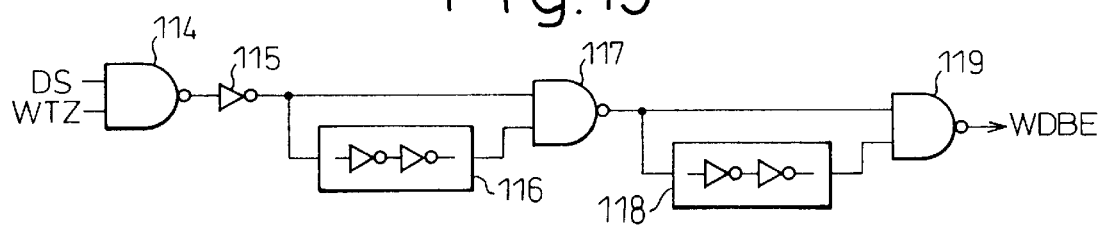
FIG. 19 is a circuit diagram showing a first configurational example of a write data bus amplifier enable signal generating circuit provided in the semiconductor memory device of the third embodiment.

FIG. 19 is a circuit diagram showing a first configurational example of the write data bus amplifier enable signal generating circuit 98. In FIG. 19, reference numeral 114 is a NAND circuit for NANDing the state indicating signal WTZ with the column selection detection signal DS, and 115 is an inverter for inverting the output of the NAND circuit 114. Further, reference numeral 116 is a variable delay circuit whose delay time is adjustable for delaying the output produced by the inverter 115, and 117 is a NAND circuit for NANDing the output of the inverter 115 with the output of the variable delay circuit 116.

Reference numeral 118 is a variable delay circuit whose delay time is adjustable for delaying the output produced by the NAND circuit 117, and 119 is a NAND circuit for outputting the write data bus amplifier enable signal WDBE by NANDing the output of the NAND circuit 117 with the output of the variable delay circuit 118.

Figure 20:
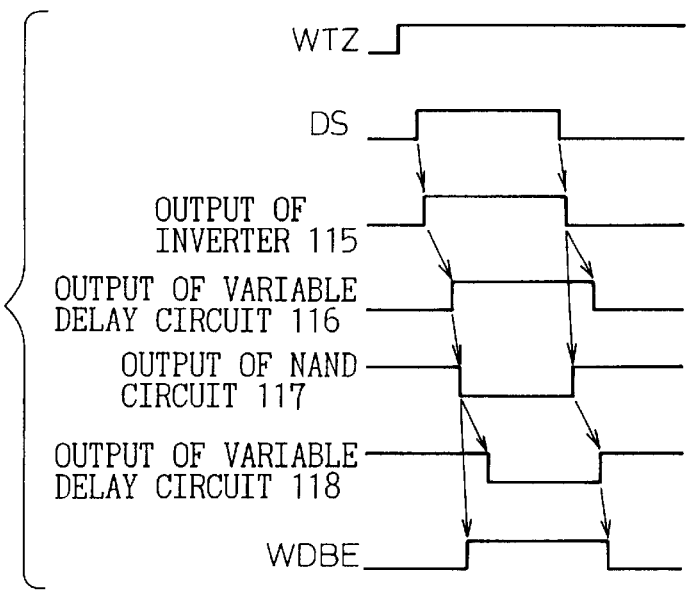
FIG. 20 is a waveform diagram illustrating the operation of the first configurational example of the write data bus amplifier enable signal generating circuit provided in the semiconductor memory device of the third embodiment.

FIG. 20 is a waveform diagram illustrating the operation of the first configurational example of the write data bus amplifier enable signal generating circuit 98. In this example, the write data bus amplifier enable signal WDBE is generated with a delay equal to the combined delay time of the NAND circuit 114, inverter 115, variable delay circuit 116, and NAND circuits 117 and 119 from the time that the column selection detection signal DS is generated, and is deactivated thereafter with a delay equal to the combined delay time of the NAND circuit 114, inverter 115, NAND circuit 117, variable delay circuit 118, and NAND circuit 119 from the time that the column selection detection signal DS is deactivated.

That is, in this example, the generation timing of the write data bus amplifier enable signal WDBE is determined relative to the generation timing of the column selection detection signal DS, and the deactivation timing of the write data bus amplifier enable signal WDBE is determined relative to the deactivation timing of the column selection detection signal DS.

Accordingly, the generation timing of the write data bus amplifier enable signal WDBE can be adjusted by adjusting the delay time in the variable delay circuit 116, and the deactivation timing of the write data bus amplifier enable signal WDBE can be adjusted by adjusting the delay time in the variable delay circuit 118.

Figure 21:
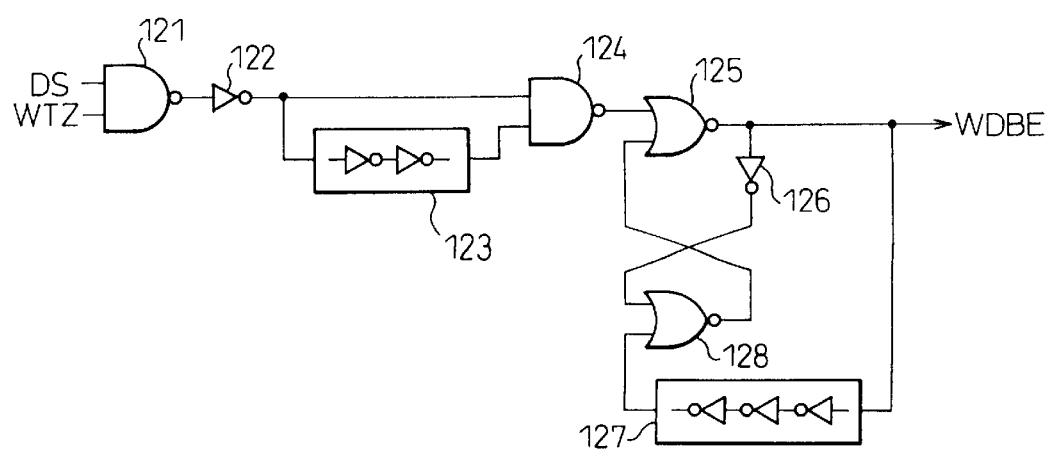
FIG. 21 is a circuit diagram showing a second configurational example of the write data bus amplifier enable signal generating circuit provided in the semiconductor memory device of the third embodiment.

FIG. 21 is a circuit diagram showing a second configurational example of the write data bus amplifier enable signal generating circuit 98. In FIG. 21, reference numeral 121 is a NAND circuit for NANDing the state indicating signal WTZ with the column selection detection signal DS, and 122 is an inverter for inverting the output of the NAND circuit 121. Further, reference numeral 123 is a variable delay circuit whose delay time is adjustable for delaying the output produced by the inverter 122, and 124 is a NAND circuit for NANDing the output of the inverter 122 with the output of the variable delay circuit 123.

Reference numeral 125 is a NOR circuit whose first input terminal is coupled to the output terminal of the NAND circuit 124, and which outputs the write data bus amplifier enable signal WDBE, and 126 is an inverter for inverting the write data bus amplifier enable signal WDBE. Further, reference numeral 127 is a variable inverting delay circuit whose delay time is adjustable for inverting and delaying the write data bus amplifier enable signal WDBE, and 128 is a NOR circuit for NORing the output of the inverter 126 with the output of the variable inverting delay circuit 127, the output terminal of the NOR circuit 128 being coupled to the second input terminal of the NOR circuit 125.

Figure 22:
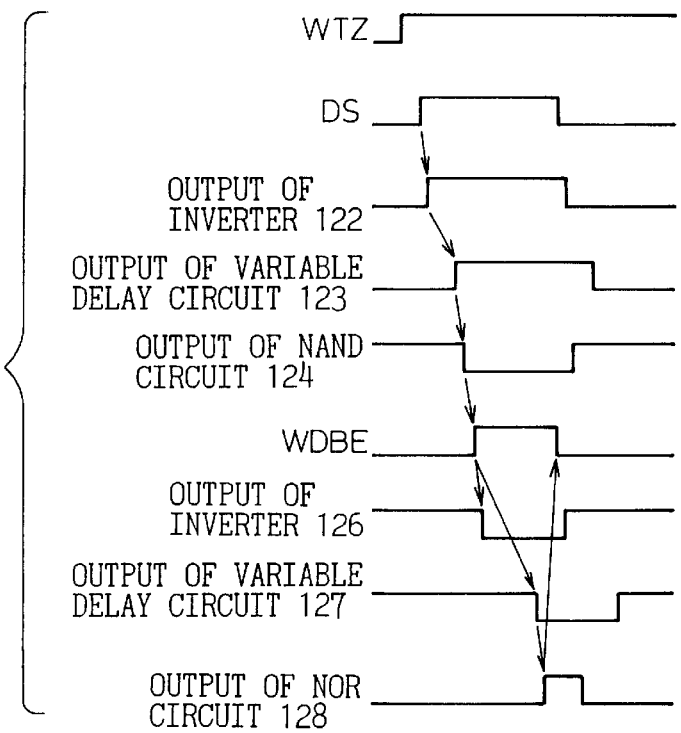
FIG. 22 is a waveform diagram illustrating the operation of the second configurational example of the write data bus amplifier enable signal generating circuit provided in the semiconductor memory device of the third embodiment.

FIG. 22 is a waveform diagram illustrating the operation of the second configurational example of the write data bus amplifier enable signal generating circuit 98. In this example, the write data bus amplifier enable signal WDBE is generated with a delay equal to the combined delay time of the NAND circuit 121, inverter 122, variable delay circuit 123, NAND circuit 124, and NOR circuit 125 from the time that the column selection detection signal DS is generated, and is deactivated thereafter with a further delay equal to the combined delay time of the variable delay circuit 127 and NOR circuits 128 and 125.

That is, in this example, the generation and deactivation timings of the write data bus amplifier enable signal WDBE are determined relative to the generation timing of the column selection detection signal DS.

Accordingly, the generation timing of the write data bus amplifier enable signal WDBE can be adjusted by adjusting the delay time in the variable delay circuit 123, and the deactivation timing of the write data bus amplifier enable signal WDBE can be adjusted by adjusting the delay time in the variable delay circuit 127.

Figure 23:
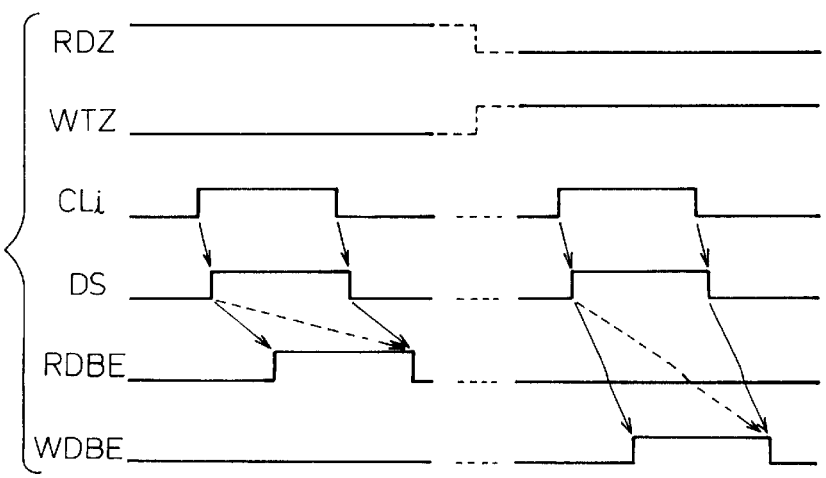
FIG. 23 is a waveform diagram for explaining the operation of the semiconductor memory device according to the third embodiment of the present invention.

FIG. 23 is a waveform diagram for explaining the operation of the semiconductor memory device according to the third embodiment of the present invention. As shown, in the third embodiment of the semiconductor memory device of the present invention, when column select signal CLi, i.e., any one of the column select signals CL0 to CL3, occurs during the period that the state indicating signal RDZ is high (indicating a read operation), the column selection detection signal DS is generated, and hence the read data bus amplifier enable signal RDBE is generated.

Further, when column select signal CLi, i.e., any one of the column select signals CL0 to CL3, occurs during the period that the state indicating signal WTZ is high (indicating a write operation), the column selection detection signal DS is generated, and hence the write data bus amplifier enable signal WDBE is generated.

In this way, in the third embodiment of the semiconductor memory device of the present invention, since provisions are made to generate the read data bus amplifier enable signal RDBE or the write data bus amplifier enable signal WDBE by detecting the selection of a column effected by the column decoder 14, the read data bus amplifier enable signal RDBE and the write data bus amplifier enable signal WDBE are both prevented from being generated before one of the column select signals CL0 to CL3 is generated, and under any conditions, either enable signal is generated only after one of the column select signals CL0 to CL3 has been generated.

Therefore, according to the third embodiment of the semiconductor memory device of the present invention, there is no need to allow a large margin for the generation timing of the read data bus amplifier enable signal RDBE or the write data bus amplifier enable signal WDBE. This permits faster operating speed for the SDRAM where the read data bus RDB for data reading and the write data bus WDB for data writing are provided separately.

Further, according to the third embodiment of the semiconductor memory device of the present invention, the generation and deactivation timings of the read data bus amplifier enable signal RDBE and the generation and deactivation timings of the write data bus amplifier enable signal WDBE can be adjusted independently of each other.

Furthermore, in the third embodiment of the semiconductor memory device of the present invention, the column decoder 14 and the column selection detecting circuit 17 are disposed opposite each other across the memory cell array 11. This arrangement serves to simplify the timing design since the generation of a column select signal can be detected at a point where the activation of the column select line is the most delayed, thus eliminating the need to consider the propagation delay through the column select line.

Next, the fourth embodiment of the present invention will be described with reference to FIG. 24.

Figure 24:
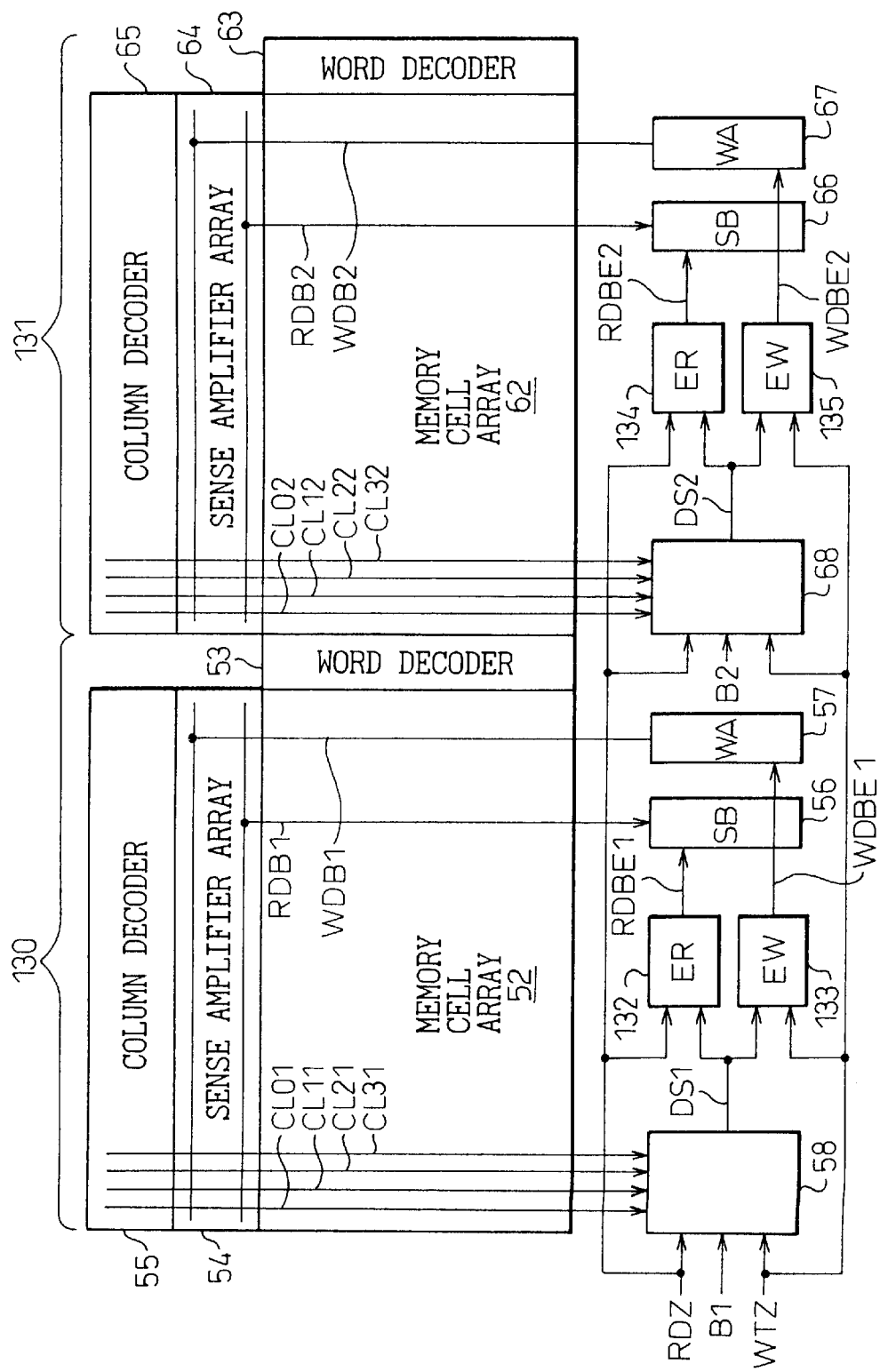
FIG. 24 is a conceptual diagram showing an essential portion of a semiconductor memory device according to a fourth embodiment of the present invention.

FIG. 24 is a conceptual diagram showing an essential portion of a semiconductor memory device according to the fourth embodiment of the present invention. In the semiconductor memory device of the fourth embodiment, memory blocks 130 and 131 are provided which have circuit configurations different from those of the memory blocks 50 and 51 of the second embodiment. Otherwise, the configuration of the semiconductor memory device of the fourth embodiment is the same as that of the second embodiment.

The memory block 130 does not have the data bus amplifier enable signal generating circuit 59 provided in the memory block 50, but instead, incorporates a read data bus amplifier enable signal generating circuit 132 and a write data bus amplifier enable signal generating circuit 133 which have circuit configurations different from those of the read data bus amplifier enable signal generating circuit 60 and write data bus amplifier enable signal generating circuit 61 provided in the memory block 50. Otherwise, the configuration of the memory block 130 is the same as that of the memory block 50.

Likewise, the memory block 131 does not have the data bus amplifier enable signal generating circuit 69 provided in the memory block 51, but instead, incorporates a read data bus amplifier enable signal generating circuit 134 and a write data bus amplifier enable signal generating circuit 135 which have circuit configurations different from those of the read data bus amplifier enable signal generating circuit 70 and write data bus amplifier enable signal generating circuit 71 provided in the memory block 51. Otherwise, the configuration of the memory block 131 is the same as that of the memory block 51.

Here, the read data bus amplifier enable signal generating circuits 132 and 134 are each identical in configuration to the read data bus amplifier enable signal generating circuit 97 provided in the semiconductor memory device of the third embodiment, and the write data bus amplifier enable signal generating circuits 133 and 135 are each identical in configuration to the write data bus amplifier enable signal generating circuit 98 provided in the semiconductor memory device of the third embodiment.

In the thus constructed semiconductor memory device of the fourth embodiment of the present invention, when the memory block 130 is selected, the memory block 130 operates in the same way as the semiconductor memory device of the third embodiment of the present invention, and the read data bus amplifier enable signal RDBE1 or the write data bus amplifier enable signal WDBE1 is generated by detecting the selection of a column effected by the column decoder 55.

As a result, neither the read data bus amplifier enable signal RDBE1 nor the write data bus amplifier enable signal WDBE1 is generated before one of the column select signals CL01 to CL31 is generated, and under any conditions, either enable signal is generated only after one of the column select signals CL01 to CL31 has been generated.

Similarly, when the memory block 131 is selected, the memory block 131 operates in the same way as the semiconductor memory device of the third embodiment of the present invention, and the read data bus amplifier enable signal RDBE2 or the write data bus amplifier enable signal WDBE2 is generated by detecting the selection of a column effected by the column decoder 65.

As a result, neither the read data bus amplifier enable signal RDBE2 nor the write data bus amplifier enable signal WDBE2 is generated before one of the column select signals CL02 to CL32 is generated, and under any conditions, either enable signal is generated only after one of the column select signals CL02 to CL32 has been generated.

Therefore, according to the fourth embodiment of the semiconductor memory device of the present invention, there is no need to allow a large margin for the generation timing of the read data bus amplifier enable signals RDBE1 and RDBE2 or the write data bus amplifier enable signals WDBE1 and WDBE2. This permits faster operating speed for the SDRAM having the two memory blocks 130 and 131 where the read data buses RDB1 and RDB2 for data reading are provided separately from the write data buses WDB1 and WDB2 for data writing.

Further, according to the fourth embodiment of the semiconductor memory device of the present invention, the generation and deactivation timings of the read data bus amplifier enable signal RDBE1, the generation and deactivation timings of the read data bus amplifier enable signal RDBE2, the generation and deactivation timings of the write data bus amplifier enable signal WDBE1, and the generation and deactivation timings of the write data bus amplifier enable signal WDBE2 can be adjusted independently of each other.

Furthermore, in the fourth embodiment of the semiconductor memory device of the present invention, the column decoder 55 and the column selection detecting circuit 58 are disposed opposite each other across the memory cell array 52, and also the column decoder 65 and the column selection detecting circuit 68 are disposed opposite each other across the memory cell array 62. This arrangement serves to simplify the timing design since the generation of a column select signal can be detected at a point where the activation of the column select line is the most delayed, thus eliminating the need to consider the propagation delay through the column select line.

The first to fourth embodiments of the semiconductor memory device of the present invention have been described for the SDRAMs where read data buses and write data buses are provided separately, but it will be appreciated that the present invention is also applicable to SDRAMs having single data buses that serve as both read data and write data buses.

Further, the first to fourth embodiments of the semiconductor memory device of the present invention have been described for the case where the present invention is applied to an SDRAM, but it will be appreciated that the present invention can be applied extensively to semiconductor memory devices that contain column selection circuitry and data buses for transferring data.

As described above, according a first mode of the present invention, in a semiconductor memory device where a data bus for data reading and a data bus for data writing are provided separately, provisions are made to activate the read data bus amplifier or the write data bus amplifier by detecting the selection of a column effected by the column selection circuit; accordingly, under any conditions, the read data bus amplifier enable signal or the write data bus amplifier enable signal can be generated after the occurrence of a column select signal. This eliminates the need to allow a large margin for the generation timing of the read data bus amplifier enable signal or the write data bus amplifier enable signal, thus making it possible to increase the operating speed of the semiconductor memory device.

Further, according a second mode of the present invention, in a semiconductor memory device where a data bus for data reading and a data bus for data writing are combined into a signal data bus, provisions are made to activate the read data bus amplifier or the write data bus amplifier by detecting the selection of a column effected by the column selection circuit; accordingly, under any conditions, the read data bus amplifier enable signal or the write data bus amplifier enable signal can be generated after the occurrence of a column select signal. This eliminates the need to allow a large margin for the generation timing of the read data bus amplifier enable signal or the write data bus amplifier enable signal, thus making it possible to increase the operating speed of the semiconductor memory device.

Furthermore, according a third mode of the present invention, in a semiconductor memory device where a data bus for data reading and a data bus for data writing are provided separately, a column selection detecting/data bus amplifier activating circuit is provided that activates the read data bus amplifier or the write data bus amplifier by detecting the selection of a column effected by the column selection circuit; accordingly, under any conditions, the read data bus amplifier enable signal or the write data bus amplifier enable signal can be generated after the occurrence of a column select signal. This eliminates the need to allow a large margin for the generation timing of the read data bus amplifier enable signal or the write data bus amplifier enable signal, thus making it possible to increase the operating speed of the semiconductor memory device.

Moreover, according a fourth mode of the present invention, in a semiconductor memory device where a data bus for data reading and a data bus for data writing are combined into a single data bus, a column selection detecting/data bus amplifier activating circuit is provided that activates the read data bus amplifier or the write data bus amplifier by detecting the selection of a column effected by the column selection circuit; accordingly, under any conditions, the read data bus amplifier enable signal or the write data bus amplifier enable signal can be generated after the occurrence of a column select signal. This eliminates the need to allow a large margin for the generation timing of the read data bus amplifier enable signal or the write data bus amplifier enable signal, thus making it possible to increase the operating speed of the semiconductor memory device.

Many different embodiments of the present invention may be constructed without departing from the spirit and scope of the present invention, and it should be understood that the present invention is not limited to the specific embodiments described in this specification, except as defined in the appended claims.

What is claimed is:

1. A data bus amplifier activation method for a semiconductor memory device having a memory cell array, a column selection circuit for selecting a column in the memory cell array, a read data bus for transferring read data, output from the column selected by the column selection circuit, to a read data bus amplifier, and a write data bus for transferring write data, output from a write data bus amplifier, to the column selected by the column selection circuit, wherein:

the read data bus amplifier or the write data bus amplifier is activated by detecting the selection of the column effected by the column selection circuit.

2. A data bus amplifier activation method for a semiconductor memory device having a memory cell array, a column selection circuit for selecting a column in the memory cell array, and a data bus for transferring read data, output from the column selected by the column selection circuit, to a read data bus amplifier, or write data, output from a write data bus amplifier, to the column selected by the column selection circuit, wherein:

the read data bus amplifier or the write data bus amplifier is activated by detecting the selection of the column effected by the column selection circuit.

3. A semiconductor memory device having a memory cell array, a column selection circuit for selecting a column in the memory cell array, a read data bus for transferring read data, output from the column selected by the column selection circuit, to a read data bus amplifier, and a write data bus for transferring write data, output from a write data bus amplifier, to the column selected by the column selection circuit, wherein:

the semiconductor memory device includes a column selection detecting/data bus amplifier activating circuit for activating the read data bus amplifier or the write data bus amplifier by detecting the selection of the column effected by the column selection circuit.

4. A semiconductor memory device as claimed in claim 3, wherein the column selection detecting/data bus amplifier activating circuit comprises a column selection detecting circuit which detects the selection of the column effected by the column selection circuit and outputs a column selection detection signal, and a data bus amplifier activating circuit which outputs a read data bus amplifier enable signal for activating the read data bus amplifier when the column selection detection signal is output at the time of reading, and which generates a write data bus amplifier enable signal for activating the write data bus amplifier when the column selection detection signal is output at the time of writing.

5. A semiconductor memory device as claimed in claim 4, wherein the column selection detecting circuit includes a wired-OR circuit for ORing column select line levels.

6. A semiconductor memory device as claimed in claim 4, wherein the data bus amplifier activating circuit comprises:

a data bus amplifier enable base signal generating circuit which takes the column selection detection signal as an input and generates a data bus amplifier enable base signal;

a read data bus amplifier enable signal generating circuit which generates the read data bus amplifier enable signal when the data bus amplifier enable base signal is generated at the time of reading; and a write data bus amplifier enable signal generating circuit which generates the write data bus amplifier enable signal when the data bus amplifier enable base signal is generated at the time of writing.

7. A semiconductor memory device as claimed in claim 6, wherein the data bus amplifier enable base signal generating circuit is constructed so that the generation timing of the data bus amplifier enable base signal is determined relative to the generation timing of the column selection detection signal.

8. A semiconductor memory device as claimed in claim 7, wherein the data bus amplifier enable base signal generating circuit includes a timing adjusting circuit capable of adjusting the generation timing of the data bus amplifier enable base signal.

9. A semiconductor memory device as claimed in claim 6, wherein the data bus amplifier enable base signal generating circuit is constructed so that the deactivation timing of the data bus amplifier enable base signal is determined relative to the deactivation timing of the column selection detection signal.

10. A semiconductor memory device as claimed in claim 9, wherein the data bus amplifier enable base signal generating circuit includes a timing adjusting circuit capable of adjusting the deactivation timing of the data bus amplifier enable signal.

11. A semiconductor memory device as claimed in claim 6, wherein the data bus amplifier enable base signal generating circuit is constructed so that the deactivation timing of the data bus amplifier enable base signal is determined relative to the generation timing of the column selection detection signal.

12. A semiconductor memory device as claimed in claim 11, wherein the data bus amplifier enable base signal generating circuit includes a timing adjusting circuit capable of adjusting the deactivation timing of the data bus amplifier enable base signal.

13. A semiconductor memory device as claimed in claim 6, wherein the data bus amplifier enable base signal generating circuit comprises:

a first variable delay circuit for delaying the column selection detection signal;

a first NAND circuit for NANDing the column selection detection signal with an output of the first variable delay circuit;

a second variable delay circuit for delaying an output of the first NAND circuit; and a second NAND circuit for outputting the data bus amplifier enable base signal by NANDing the output of the first NAND circuit with an output of the second variable delay circuit.

14. A semiconductor memory device as claimed in claim 6, wherein the data bus amplifier enable base signal generating circuit comprises:

a variable delay circuit for delaying the column selection detection signal;

a NAND circuit for NANDing the column selection detection signal with an output of the variable delay circuit;

a first NOR circuit, with one input terminal thereof coupled to an output terminal of the NAND circuit, for outputting the data bus amplifier enable base signal;

an inverter for inverting the data bus amplifier enable base signal;

a variable inverting delay circuit for inverting and delaying the data bus amplifier enable base signal; and a second NOR circuit, with an output terminal thereof coupled to the other input terminal of the first NOR circuit, for NORing an output of the inverter with an output of the variable inverting delay circuit.

15. A semiconductor memory device as claimed in claim 6, wherein the read data bus amplifier enable signal generating circuit includes a first logic circuit for performing a logic operation between the data bus amplifier enable base signal and a first state indicating signal that indicates whether or not reading is taking place, and the write data bus amplifier enable signal generating circuit includes a second logic circuit for performing a logic operation between the data bus amplifier enable base signal and a second state indicating signal that indicates whether or not writing is taking place.

16. A semiconductor memory device as claimed in claim 15, wherein the first logic circuit includes a first AND circuit for ANDing the first state indicating signal with the data bus amplifier enable base signal, and the second logic circuit includes a second AND circuit for ANDing the second state indicating signal with the data bus amplifier enable base signal.

17. A semiconductor memory device as claimed in claim 4, wherein the data bus amplifier activating circuit comprises:

a read data bus amplifier enable signal generating circuit which generates the read data bus amplifier enable signal when the column selection detection signal is generated at the time of reading; and a write data bus amplifier enable signal generating circuit which generates the write data bus amplifier enable signal when the column selection detection signal is generated at the time of writing.

18. A semiconductor memory device as claimed in claim 17, wherein the read data bus amplifier enable signal generating circuit is constructed so that the generation timing of the read data bus amplifier enable signal is determined relative to the generation timing of the column selection detection signal.

19. A semiconductor memory device as claimed in claim 18, wherein the read data bus amplifier enable signal generating circuit includes a timing adjusting circuit capable of adjusting the generation timing of the read data bus amplifier enable signal.

20. A semiconductor memory device as claimed in claim 17, wherein the read data bus amplifier enable signal generating circuit is constructed so that the deactivation timing of the read data bus amplifier enable signal is determined relative to the deactivation timing of the column selection detection signal.

21. A semiconductor memory device as claimed in claim 20, wherein the read data bus amplifier enable signal generating circuit includes a timing adjusting circuit capable of adjusting the deactivation timing of the read data bus amplifier enable signal.

22. A semiconductor memory device as claimed in claim 17, wherein the read data bus amplifier enable signal generating circuit is constructed so that the deactivation timing of the read data bus amplifier enable signal is determined relative to the generation timing of the column selection detection signal.

23. A semiconductor memory device as claimed in claim 22, wherein the read data bus amplifier enable signal generating circuit includes a timing adjusting circuit capable of adjusting the deactivation timing of the read data bus amplifier enable signal.

24. A semiconductor memory device as claimed in claim 17, wherein the read data bus amplifier enable signal generating circuit comprises:

an AND circuit for ANDing the column selection detection signal with a first state indicating signal that indicates whether or not reading is taking place;

a first variable delay circuit for delaying an output of the AND circuit;

a first NAND circuit for NANDing the output of the AND circuit with an output of the first variable delay circuit;

a second variable delay circuit for delaying an output of the first NAND circuit; and a second NAND circuit for outputting the read data bus amplifier enable signal by NANDing the output of the first NAND circuit with an output of the second variable delay circuit.

25. A semiconductor memory device as claimed in claim 17, wherein the read data bus amplifier enable signal generating circuit comprises:

an AND circuit for ANDing the column selection detection signal with a first state indicating signal that indicates whether or not reading is taking place;

a variable delay circuit for delaying an output of the AND circuit;

a NAND circuit for NANDing the output of the AND circuit with an output of the variable delay circuit;

a first NOR circuit, with one input terminal thereof coupled to an output terminal of the NAND circuit, for outputting the read data bus amplifier enable signal;

an inverter for inverting the read data bus amplifier enable signal;

a variable inverting delay circuit for inverting and delaying the read data bus amplifier enable signal; and a second NOR circuit, with an output terminal thereof coupled to the other input terminal of the first NOR circuit, for NORing an output of the inverter with an output of the variable inverting delay circuit.

26. A semiconductor memory device as claimed in claim 17, wherein the write data bus amplifier enable signal generating circuit is constructed so that the generation timing of the write data bus amplifier enable signal is determined relative to the generation timing of the column selection detection signal.

27. A semiconductor memory device as claimed in claim 26, wherein the write data bus amplifier enable signal generating circuit includes a timing adjusting circuit capable of adjusting the generation timing of the write data bus amplifier enable signal.

28. A semiconductor memory device as claimed in claim 17, wherein the write data bus amplifier enable signal generating circuit is constructed so that the deactivation timing of the write data bus amplifier enable signal is determined relative to the deactivation timing of the column selection detection signal.

29. A semiconductor memory device as claimed in claim 28, wherein the write data bus amplifier enable signal generating circuit includes a timing adjusting circuit capable of adjusting the deactivation timing of the write data bus amplifier enable signal.

30. A semiconductor memory device as claimed in claim 17, wherein the write data bus amplifier enable signal generating circuit is constructed so that the deactivation timing of the write data bus amplifier enable signal is determined relative to the generation timing of the column selection detection signal.

31. A semiconductor memory device as claimed in claim 30, wherein the write data bus amplifier enable signal generating circuit includes a timing adjusting circuit capable of adjusting the deactivation timing of the write data bus amplifier enable signal.

32. A semiconductor memory device as claimed in claim 17, wherein the write data bus amplifier enable signal generating circuit comprises:

an AND circuit for ANDing the column selection detection signal with a second state indicating signal that indicates whether or not writing is taking place;

a first variable delay circuit for delaying an output of the AND circuit;

a first NAND circuit for NANDing the output of the AND circuit with an output of the first variable delay circuit;

a second variable delay circuit for delaying an output of the first NAND circuit; and a second NAND circuit for outputting the write data bus amplifier enable signal by NANDing the output of the first NAND circuit with an output of the second variable delay circuit.

33. A semiconductor memory device as claimed in claim 17, wherein the write data bus amplifier enable signal generating circuit comprises:

an AND circuit for ANDing the column selection detection signal with a second state indicating signal that indicates whether or not writing is taking place;

a variable delay circuit for delaying an output of the AND circuit;

a NAND circuit for NANDing the output of the AND circuit with an output of the variable delay circuit;

a first NOR circuit, with one input terminal thereof coupled to an output terminal of the NAND circuit, for outputting the write data bus amplifier enable signal;

an inverter for inverting the write data bus amplifier enable signal;

a variable inverting delay circuit for inverting and delaying the write data bus amplifier enable signal; and a second NOR circuit, with an output terminal thereof coupled to the other input terminal of the first NOR circuit, for NORing an output of the inverter with an output of the variable inverting delay circuit.

34. A semiconductor memory device as claim in claim 3, wherein the column selection circuit and the column selection detecting circuit are disposed opposite each other across the memory cell array.

35. A semiconductor memory device having a memory cell array, a column selection circuit for selecting a column in the memory cell array, and a data bus for transferring read data, output from the column selected by the column selection circuit, to a read data bus amplifier, or write data, output from a write data bus amplifier, to the column selected by the column selection circuit, wherein:

the semiconductor memory device includes a column selection detecting/data bus amplifier activating circuit for activating the read data bus amplifier or the write data bus amplifier by detecting the selection of the column effected by the column selection circuit.

36. A semiconductor memory device as claimed in claim 35, wherein the column selection detecting/data bus amplifier activating circuit comprises a column selection detecting circuit which detects the selection of the column effected by the column selection circuit and outputs a column selection detection signal, and a data bus amplifier activating circuit which outputs a read data bus amplifier enable signal for activating the read data bus amplifier when the column selection detection signal is output at the time of reading, and which generates a write data bus amplifier enable signal for activating the write data bus amplifier when the column selection detection signal is output at the time of writing.

37. A semiconductor memory device as claimed in claim 36, wherein the column selection detecting circuit includes a wired-OR circuit for ORing column select line levels.

38. A semiconductor memory device as claimed in claim 36, wherein the data bus amplifier activating circuit comprises:

a data bus amplifier enable base signal generating circuit which takes the column selection detection signal as an input and generates a data bus amplifier enable base signal;

a read data bus amplifier enable signal generating circuit which generates the read data bus amplifier enable signal when the data bus amplifier enable base signal is generated at the time of reading; and a write data bus amplifier enable signal generating circuit which generates the write data bus amplifier enable signal when the data bus amplifier enable base signal is generated at the time of writing.

39. A semiconductor memory device as claimed in claim 38, wherein the data bus amplifier enable base signal generating circuit is constructed so that the generation timing of the data bus amplifier enable base signal is determined relative to the generation timing of the column selection detection signal.

40. A semiconductor memory device as claimed in claim 39, wherein the data bus amplifier enable base signal generating circuit includes a timing adjusting circuit capable of adjusting the generation timing of the data bus amplifier enable base signal.

41. A semiconductor memory device as claimed in claim 38, wherein the data bus amplifier enable base signal generating circuit is constructed so that the deactivation timing of the data bus amplifier enable base signal is determined relative to the deactivation timing of the column selection detection signal.

42. A semiconductor memory device as claimed in claim 41, wherein the data bus amplifier enable base signal generating circuit includes a timing adjusting circuit capable of adjusting the deactivation timing of the data bus amplifier enable signal.

43. A semiconductor memory device as claimed in claim 38, wherein the data bus amplifier enable base signal generating circuit is constructed so that the deactivation timing of the data bus amplifier enable base signal is determined relative to the generation timing of the column selection detection signal.

44. A semiconductor memory device as claimed in claim 43, wherein the data bus amplifier enable base signal generating circuit includes a timing adjusting circuit capable of adjusting the deactivation timing of the data bus amplifier enable base signal.

45. A semiconductor memory device as claimed in claim 38, wherein the data bus amplifier enable base signal generating circuit comprises:

a first variable delay circuit for delaying the column selection detection signal;

a first NAND circuit for NANDing the column selection detection signal with an output of the first variable delay circuit;

a second variable delay circuit for delaying an output of the first NAND circuit; and a second NAND circuit for outputting the data bus amplifier enable base signal by NANDing the output of the first NAND circuit with an output of the second variable delay circuit.

46. A semiconductor memory device as claimed in claim 38, wherein the data bus amplifier enable base signal generating circuit comprises:

a variable delay circuit for delaying the column selection detection signal;

a NAND circuit for NANDing the column selection detection signal with an output of the variable delay circuit;

a first NOR circuit, with one input terminal thereof coupled to an output terminal of the NAND circuit, for outputting the data bus amplifier enable base signal;

an inverter for inverting the data bus amplifier enable base signal;

a variable inverting delay circuit for inverting and delaying the data bus amplifier enable base signal; and a second NOR circuit, with an output terminal thereof coupled to the other input terminal of the first NOR circuit, for NORing an output of the inverter with an output of the variable inverting delay circuit.

47. A semiconductor memory device as claimed in claim 38, wherein the read data bus amplifier enable signal generating circuit includes a first logic circuit for performing a logic operation between the data bus amplifier enable base signal and a first state indicating signal that indicates whether or not reading is taking place, and the write data bus amplifier enable signal generating circuit includes a second logic circuit for performing a logic operation between the data bus amplifier enable base signal and a second state indicating signal that indicates whether or not writing is taking place.

48. A semiconductor memory device as claimed in claim 47, wherein the first logic circuit includes a first AND circuit for ANDing the first state indicating signal with the data bus amplifier enable base signal, and the second logic circuit includes a second AND circuit for ANDing the second state indicating signal with the data bus amplifier enable base signal.

49. A semiconductor memory device as claimed in claim 36, wherein the data bus amplifier activating circuit comprises:

a read data bus amplifier enable signal generating circuit which generates the read data bus amplifier enable signal when the column selection detection signal is generated at the time of reading; and a write data bus amplifier enable signal generating circuit which generates the write data bus amplifier enable signal when the column selection detection signal is generated at the time of writing.

50. A semiconductor memory device as claimed in claim 49, wherein the read data bus amplifier enable signal generating circuit is constructed so that the generation timing of the read data bus amplifier enable signal is determined relative to the generation timing of the column selection detection signal.

51. A semiconductor memory device as claimed in claim 50, wherein the read data bus amplifier enable signal generating circuit includes a timing adjusting circuit capable of adjusting the generation timing of the read data bus amplifier enable signal.

52. A semiconductor memory device as claimed in claim 49, wherein the read data bus amplifier enable signal generating circuit is constructed so that the deactivation timing of the read data bus amplifier enable signal is determined relative to the deactivation timing of the column selection detection signal.

53. A semiconductor memory device as claimed in claim 52, wherein the read data bus amplifier enable signal generating circuit includes a timing adjusting circuit capable of adjusting the deactivation timing of the read data bus amplifier enable signal.

54. A semiconductor memory device as claimed in claim 49, wherein the read data bus amplifier enable signal generating circuit is constructed so that the deactivation timing of the read data bus amplifier enable signal is determined relative to the generation timing of the column selection detection signal.

55. A semiconductor memory device as claimed in claim 54, wherein the read data bus amplifier enable signal generating circuit includes a timing adjusting circuit capable of adjusting the deactivation timing of the read data bus amplifier enable signal.

56. A semiconductor memory device as claimed in claim 49, wherein the read data bus amplifier enable signal generating circuit comprises:

an AND circuit for ANDing the column selection detection signal with a first state indicating signal that indicates whether or not reading is taking place;

a first variable delay circuit for delaying an output of the AND circuit;

a first NAND circuit for NANDing the output of the AND circuit with an output of the first variable delay circuit;

a second variable delay circuit for delaying an output of the first NAND circuit; and a second NAND circuit for outputting the read data bus amplifier enable signal by NANDing the output of the first NAND circuit with an output of the second variable delay circuit.

57. A semiconductor memory device as claimed in claim 49, wherein the read data bus amplifier enable signal generating circuit comprises:

an AND circuit for ANDing the column selection detection signal with a first state indicating signal that indicates whether or not reading is taking place;

a variable delay circuit for delaying an output of the AND circuit;

a NAND circuit for NANDing the output of the AND circuit with an output of the variable delay circuit;

a first NOR circuit, with one input terminal thereof coupled to an output terminal of the NAND circuit, for outputting the read data bus amplifier enable signal;

an inverter for inverting the read data bus amplifier enable signal;

a variable inverting delay circuit for inverting and delaying the read data bus amplifier enable signal; and a second NOR circuit, with an output terminal thereof coupled to the other input terminal of the first NOR circuit, for NORing an output of the inverter with an output of the variable inverting delay circuit.

58. A semiconductor memory device as claimed in claim 49, wherein the write data bus amplifier enable signal generating circuit is constructed so that the generation timing of the write data bus amplifier enable signal is determined relative to the generation timing of the column selection detection signal.

59. A semiconductor memory device as claimed in claim 58, wherein the write data bus amplifier enable signal generating circuit includes a timing adjusting circuit capable of adjusting the generation timing of the write data bus amplifier enable signal.

60. A semiconductor memory device as claimed in claim 49, wherein the write data bus amplifier enable signal generating circuit is constructed so that the deactivation timing of the write data bus amplifier enable signal is determined relative to the deactivation timing of the column selection detection signal.

61. A semiconductor memory device as claimed in claim 60, wherein the write data bus amplifier enable signal generating circuit includes a timing adjusting circuit capable of adjusting the deactivation timing of the write data bus amplifier enable signal.

62. A semiconductor memory device as claimed in claim 49, wherein the write data bus amplifier enable signal generating circuit is constructed so that the deactivation timing of the write data bus amplifier enable signal is determined relative to the generation timing of the column selection detection signal.

63. A semiconductor memory device as claimed in claim 62, wherein the write data bus amplifier enable signal generating circuit includes a timing adjusting circuit capable of adjusting the deactivation timing of the write data bus amplifier enable signal.

64. A semiconductor memory device as claimed in claim 49, wherein the write data bus amplifier enable signal generating circuit comprises:

an AND circuit for ANDing the column selection detection signal with a second state indicating signal that indicates whether or not writing is taking place;

a first variable delay circuit for delaying an output of the AND circuit;

a first NAND circuit for NANDing the output of the AND circuit with an output of the first variable delay circuit;

a second variable delay circuit for delaying an output of the first NAND circuit; and a second NAND circuit for outputting the write data bus amplifier enable signal by NANDing the output of the first NAND circuit with an output of the second variable delay circuit.

65. A semiconductor memory device as claimed in claim 49, wherein the write data bus amplifier enable signal generating circuit comprises:

an AND circuit for ANDing the column selection detection signal with a second state indicating signal that indicates whether or not writing is taking place;

a variable delay circuit for delaying an output of the AND circuit;

a NAND circuit for NANDing the output of the AND circuit with an output of the variable delay circuit;

a first NOR circuit, with one input terminal thereof coupled to an output terminal of the NAND circuit, for outputting the write data bus amplifier enable signal;

an inverter for inverting the write data bus amplifier enable signal;

a variable inverting delay circuit for inverting and delaying the write data bus amplifier enable signal; and a second NOR circuit, with an output terminal thereof coupled to the other input terminal of the first NOR circuit, for NORing an output of the inverter with an output of the variable inverting delay circuit.

66. A semiconductor memory device as claimed in claim 35, wherein the column selection circuit and the column selection detecting circuit are disposed opposite each other across the memory cell array.

* * * * *